(12) United States Patent
Choi

(10) Patent No.: US 10,840,344 B2
(45) Date of Patent: Nov. 17, 2020

(54) SEMICONDUCTOR DEVICE AND MANUFACTURING METHOD OF SEMICONDUCTOR DEVICE

(71) Applicant: SK hynix Inc., Icheon-si (KR)

(72) Inventor: Kang Sik Choi, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 30 days.

(21) Appl. No.: 16/189,563

(22) Filed: Nov. 13, 2018

(65) Prior Publication Data

US 2019/0305096 A1 Oct. 3, 2019

(30) Foreign Application Priority Data

Apr. 3, 2018 (KR) .......................... 10-2018-0038830

(51) Int. Cl.
*H01L 29/417* (2006.01)
*H01L 27/11582* (2017.01)

(52) U.S. Cl.
CPC .. *H01L 29/41741* (2013.01); *H01L 27/11582* (2013.01)

(58) Field of Classification Search
CPC ......... H01L 27/11565; H01L 27/11582; H01L 29/41741
USPC ........................................................ 257/324
See application file for complete search history.

(56) References Cited

U.S. PATENT DOCUMENTS

| | | | |
|---|---|---|---|
| 9,355,727 B1 | 5/2016 | Zhang et al. | |
| 9,437,606 B2 | 9/2016 | Makala et al. | |
| 2007/0029607 A1 | 2/2007 | Kouznetzov | |
| 2010/0159657 A1 | 6/2010 | Arai et al. | |
| 2011/0180941 A1 | 7/2011 | Hwang et al. | |
| 2014/0329379 A1 | 11/2014 | Kim et al. | |
| 2016/0225754 A1 | 8/2016 | Jang | |
| 2016/0247817 A1 | 8/2016 | Lee et al. | |
| 2017/0221756 A1 | 8/2017 | Tsutsumi et al. | |
| 2018/0053768 A1 | 2/2018 | Kim et al. | |
| 2018/0108672 A1 | 4/2018 | Choi et al. | |
| 2019/0019808 A1 | 1/2019 | Choi | |
| 2020/0176467 A1* | 6/2020 | Choi | ................ H01L 27/11524 |

FOREIGN PATENT DOCUMENTS

| | | |
|---|---|---|
| KR | 1020120041314 A | 5/2012 |
| KR | 1020160001408 A | 1/2016 |
| KR | 1020190008676 A | 1/2019 |

* cited by examiner

*Primary Examiner* — Hrayr A Sayadian
(74) *Attorney, Agent, or Firm* — William Park & Associates Ltd.

(57) ABSTRACT

A semiconductor device and a manufacturing method thereof includes a source contact structure, a gate stack structure including a side region adjacent to the source contact structure, and a center region extending from the side region. The semiconductor device further includes a source gate pattern disposed under the side region of the first gate stack structure. The source gate pattern has an inclined surface facing the source contact structure. The semiconductor device also includes a channel pattern penetrating the center region of the gate stack structure, the channel pattern extending toward and contacting the source contact structure.

28 Claims, 31 Drawing Sheets

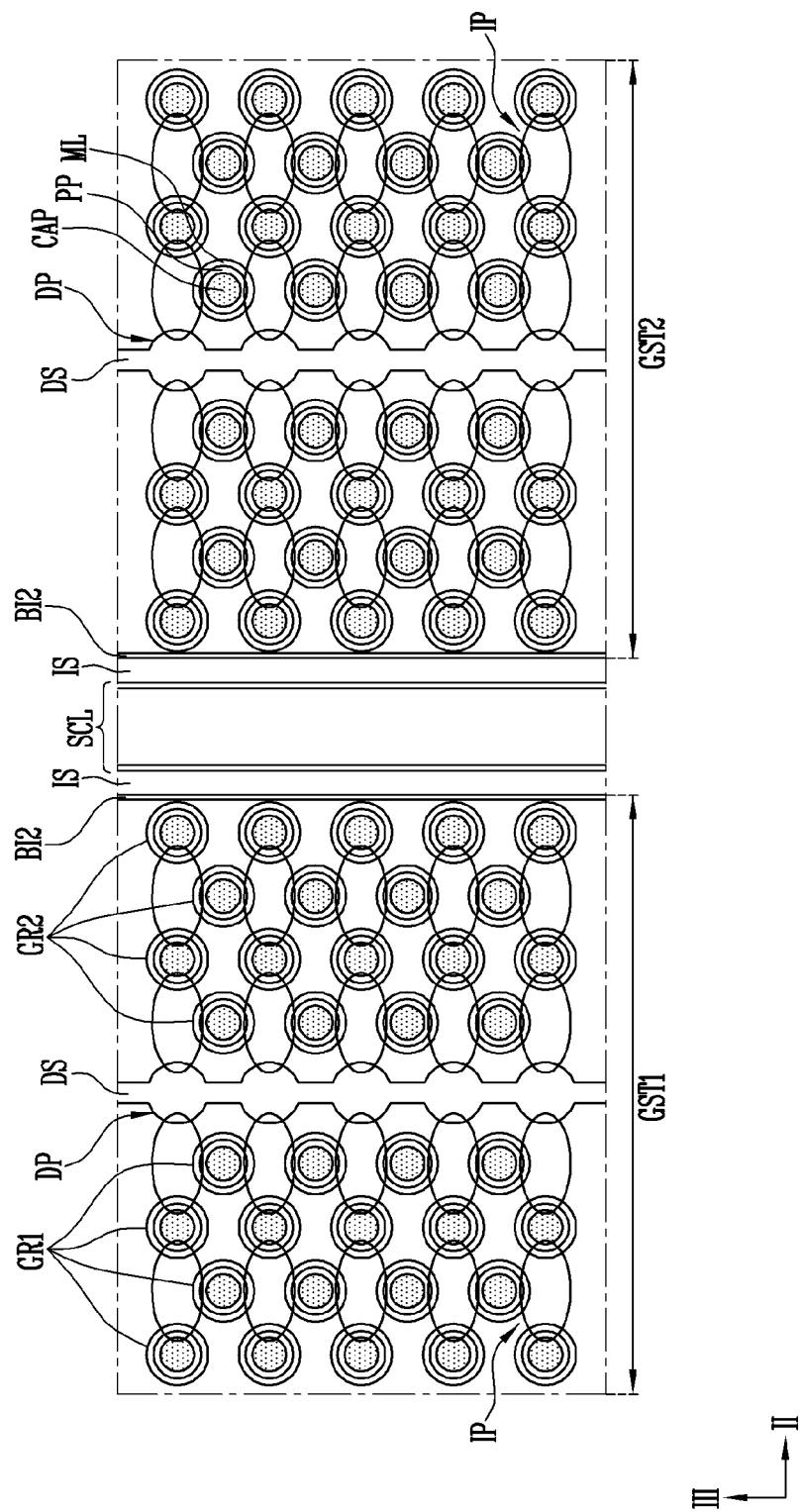

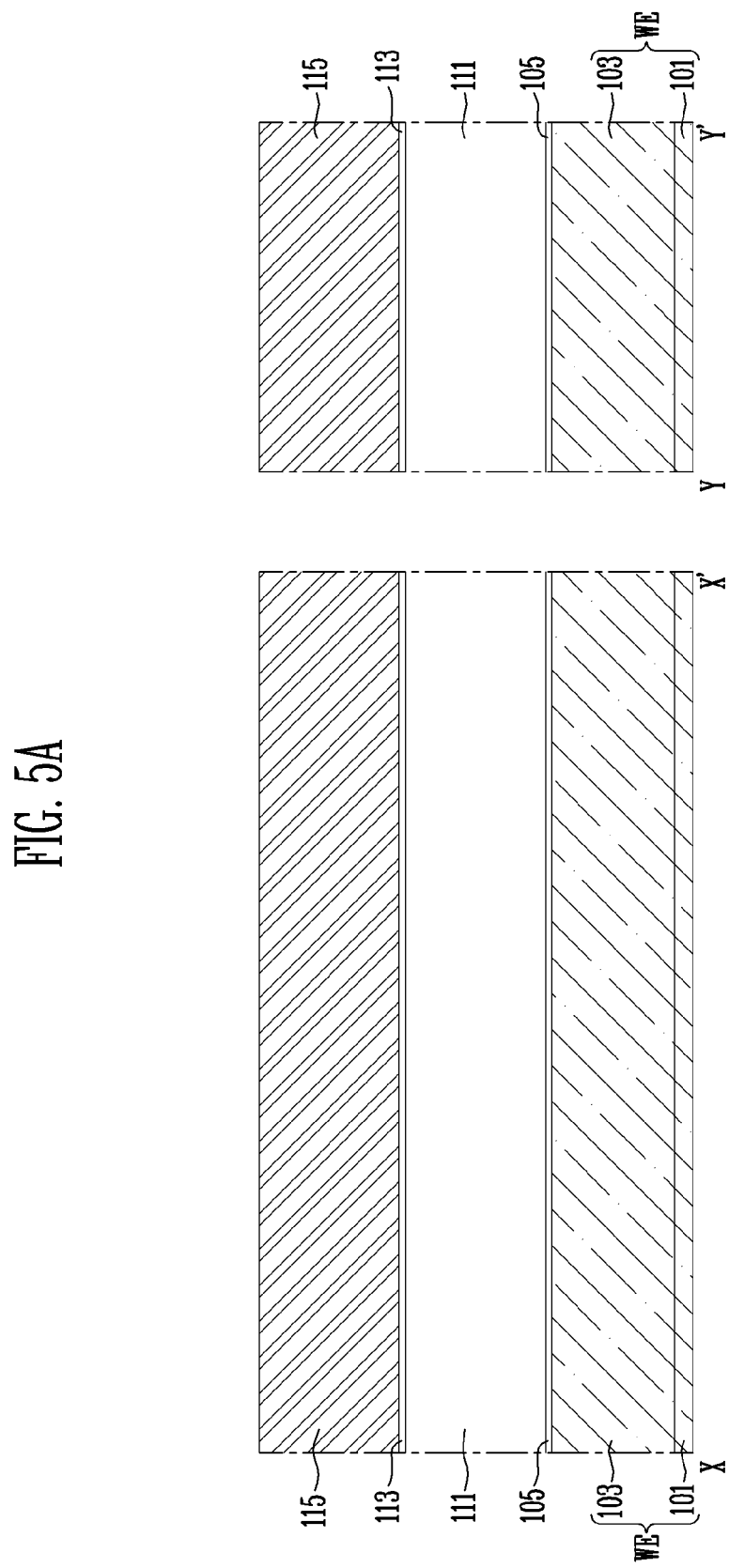

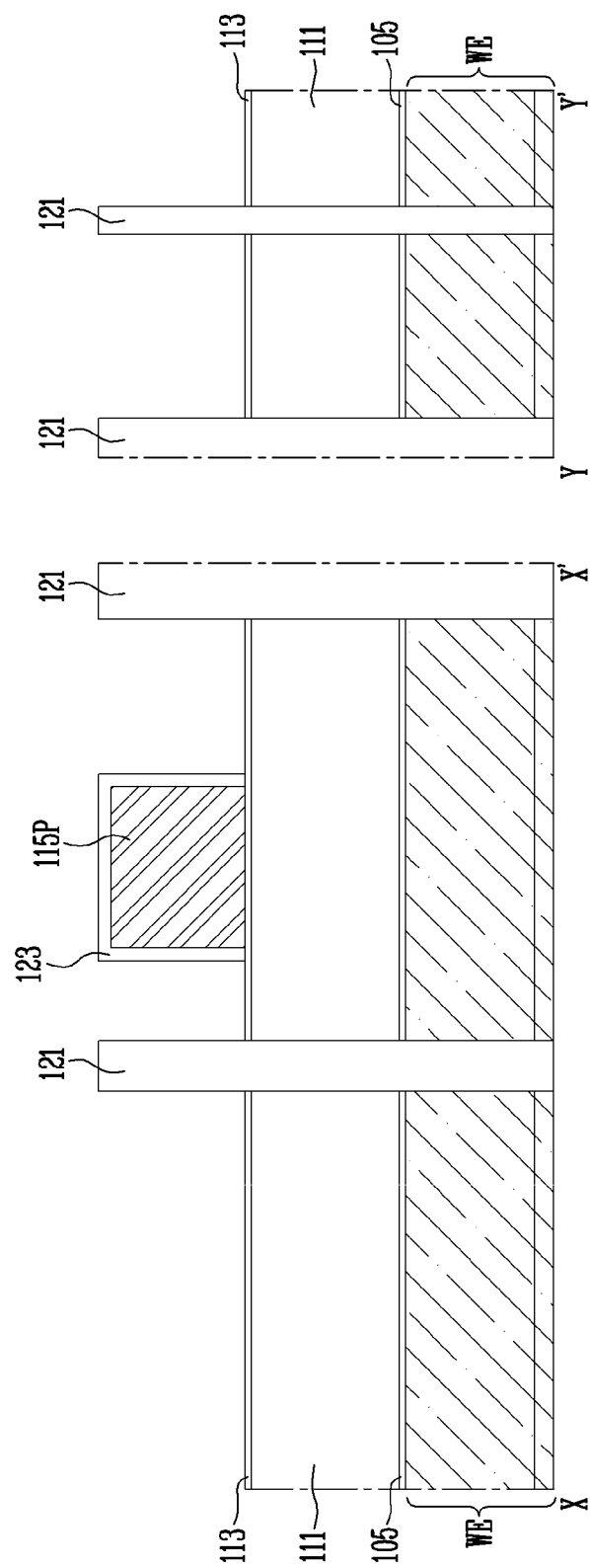

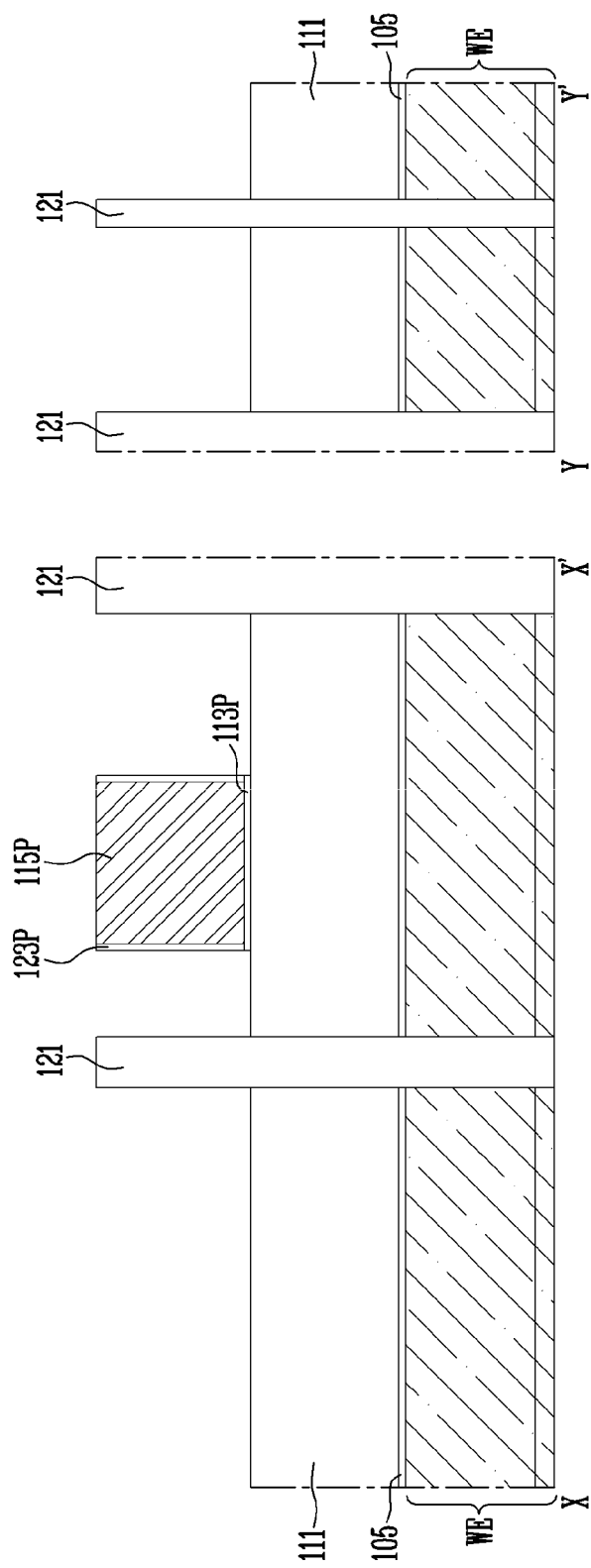

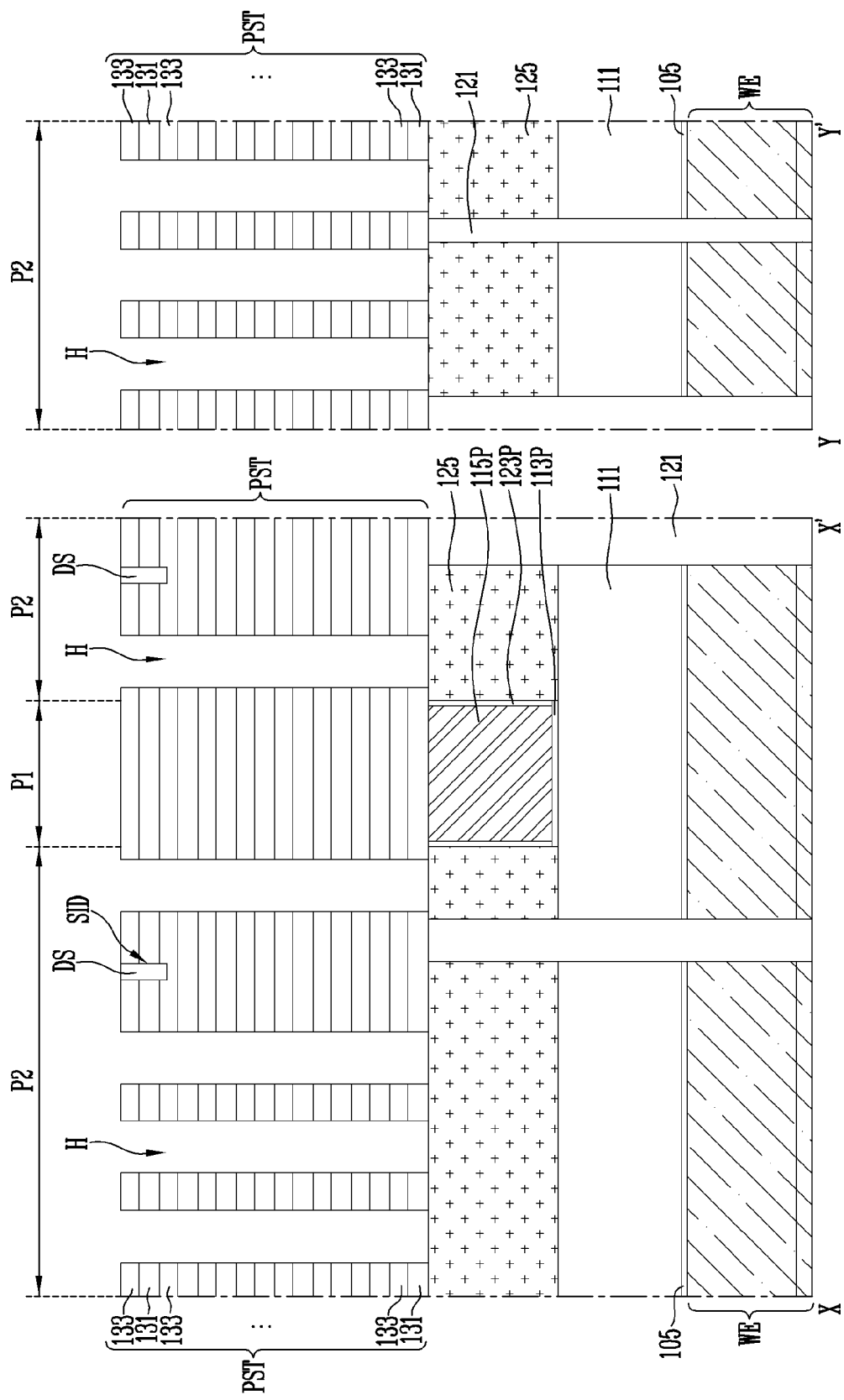

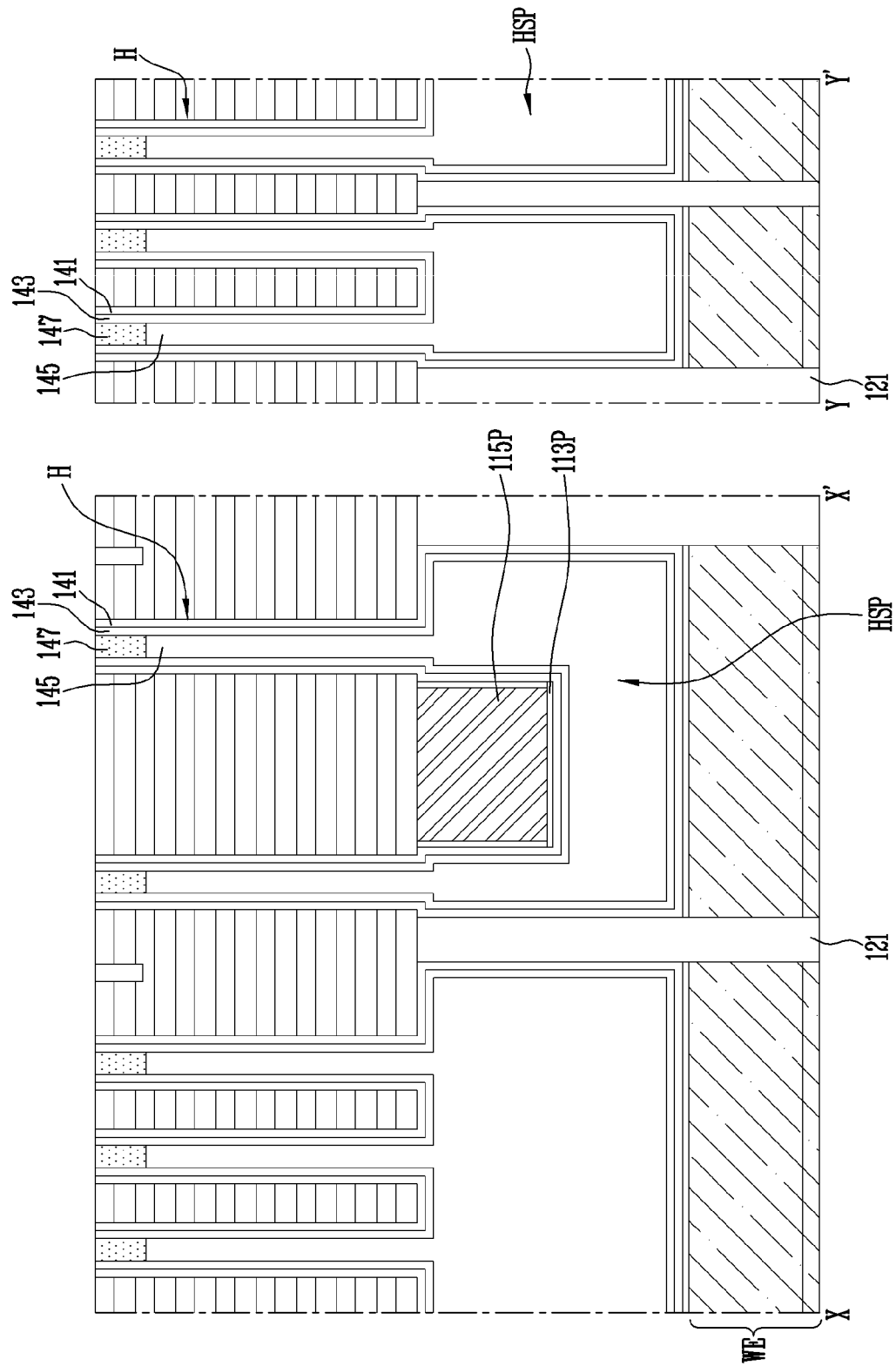

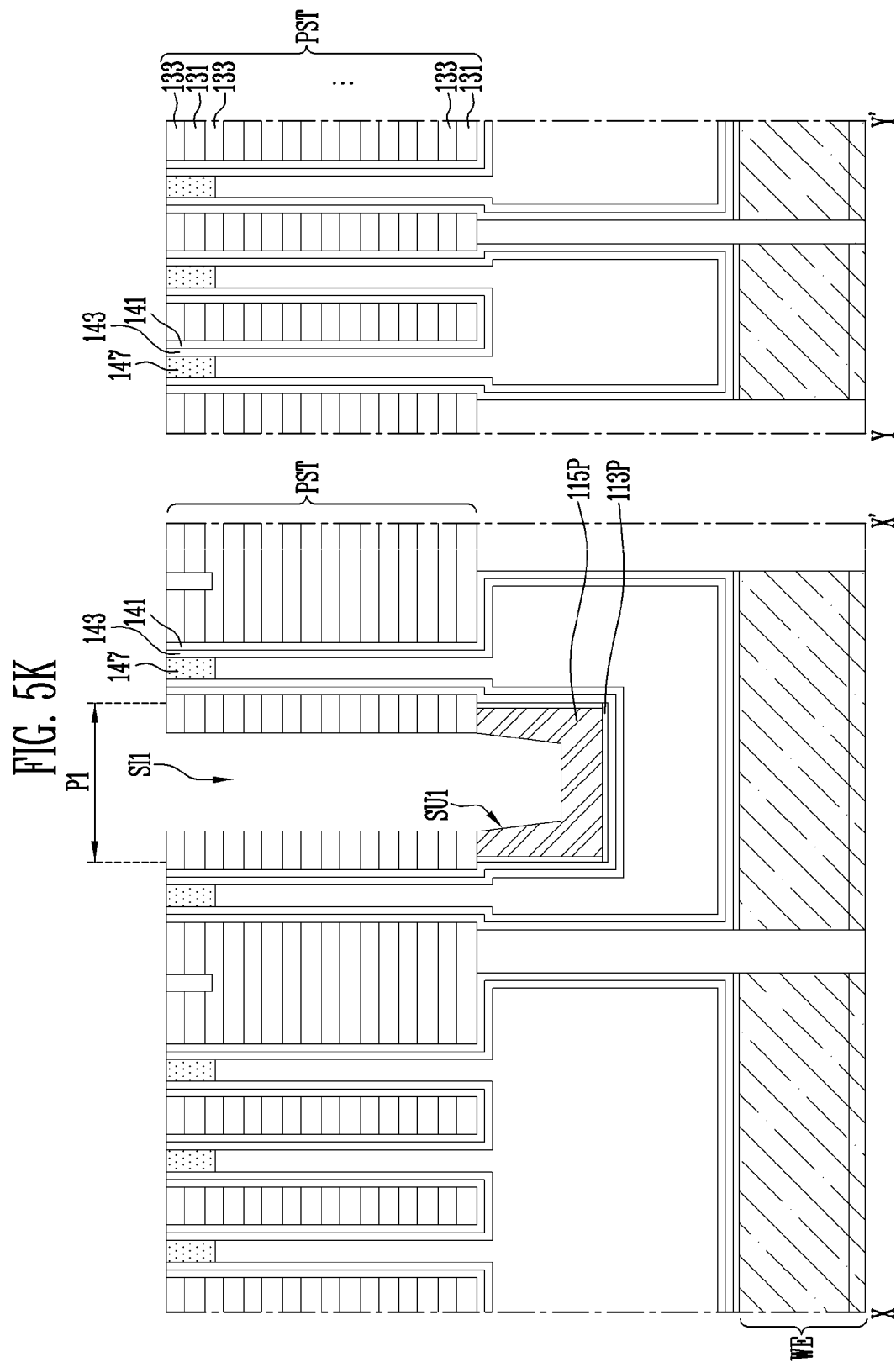

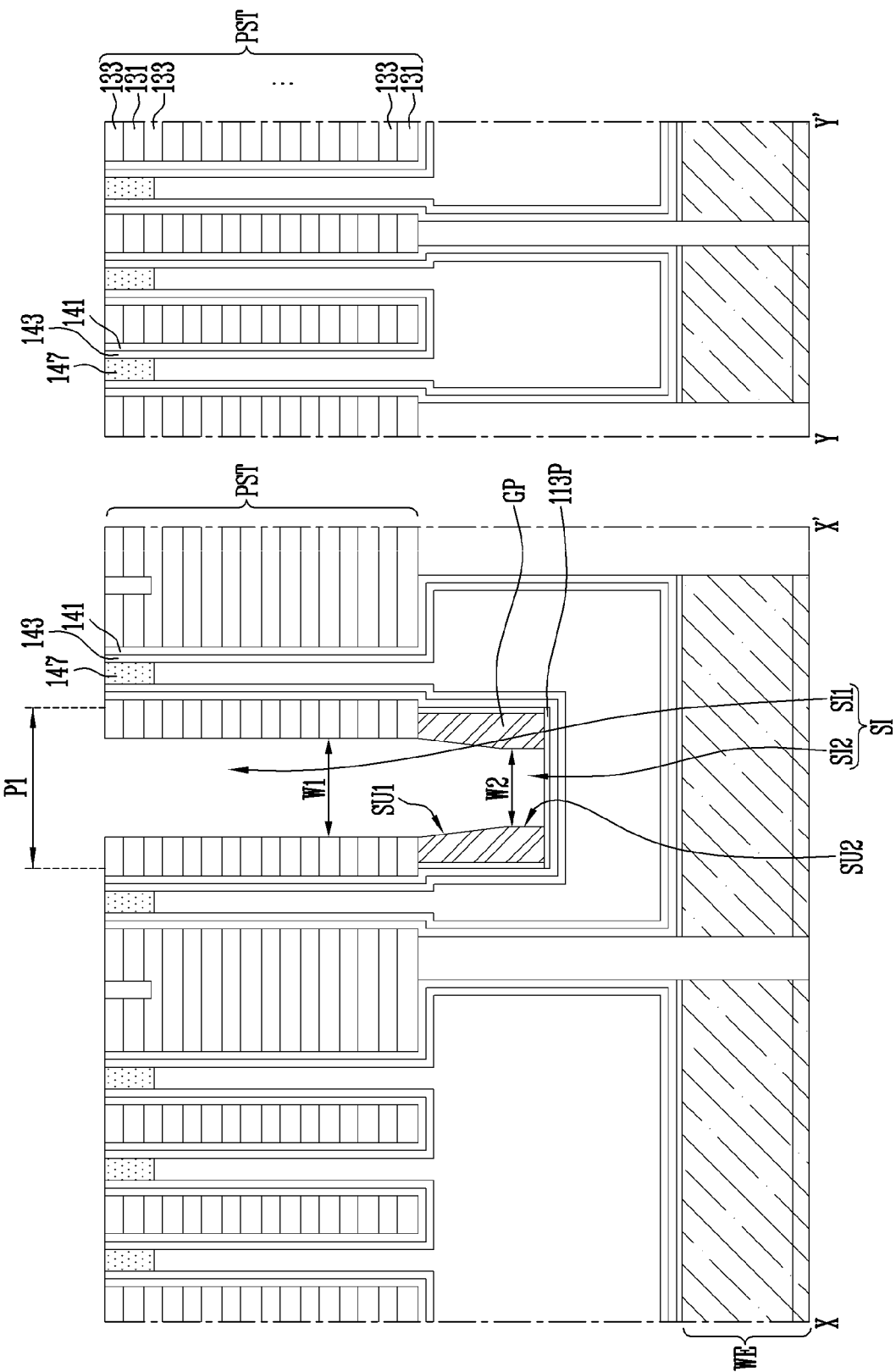

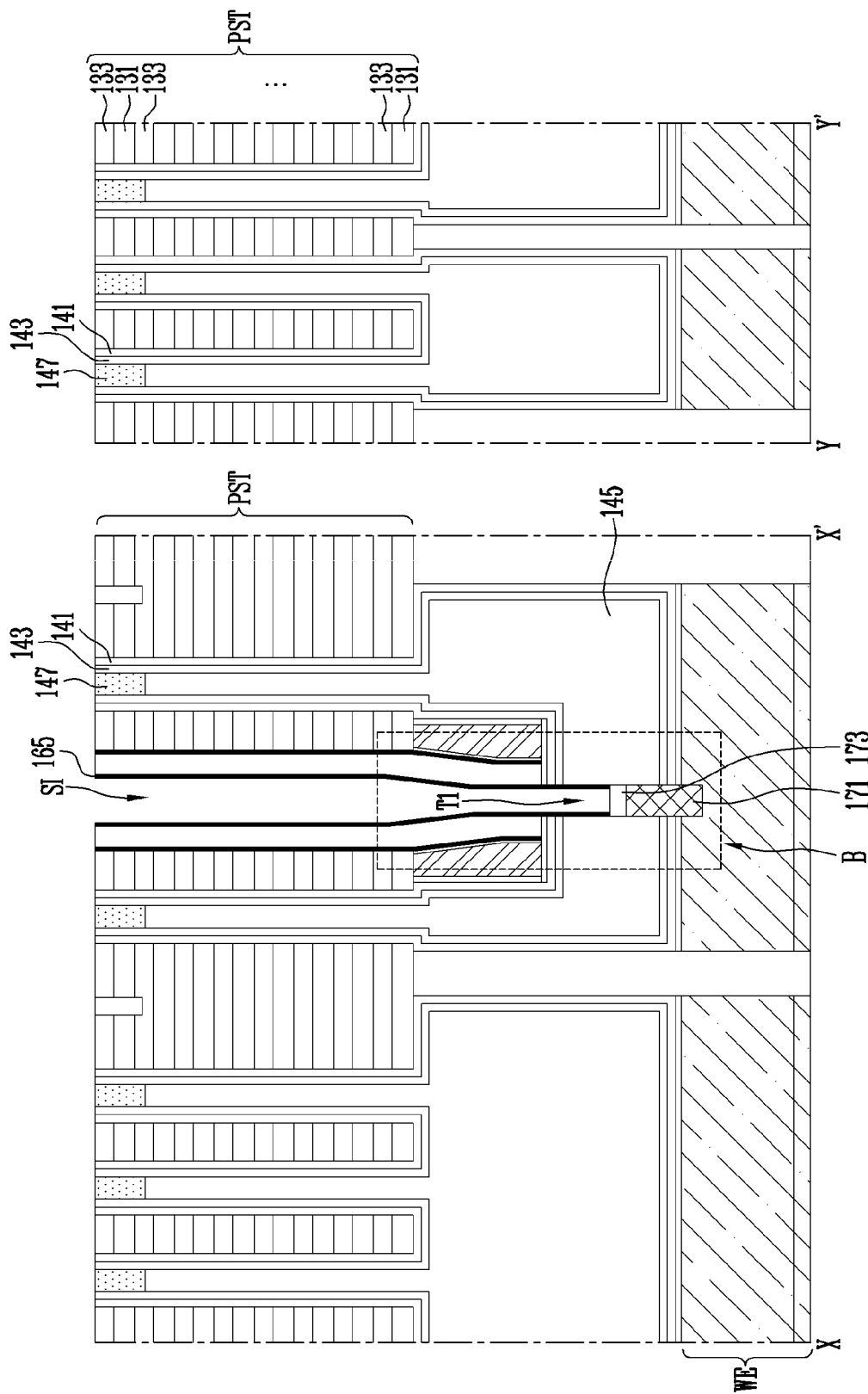

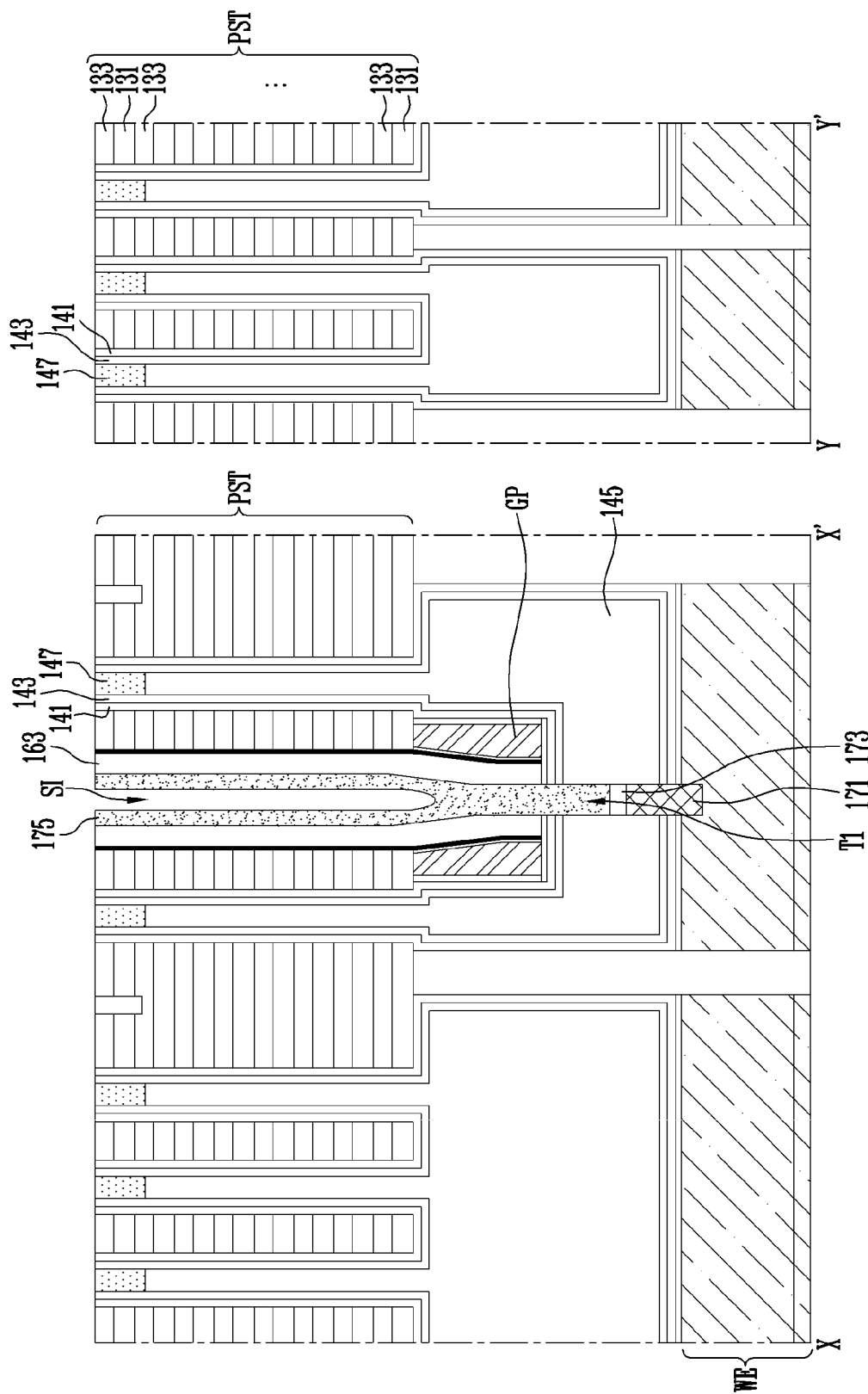

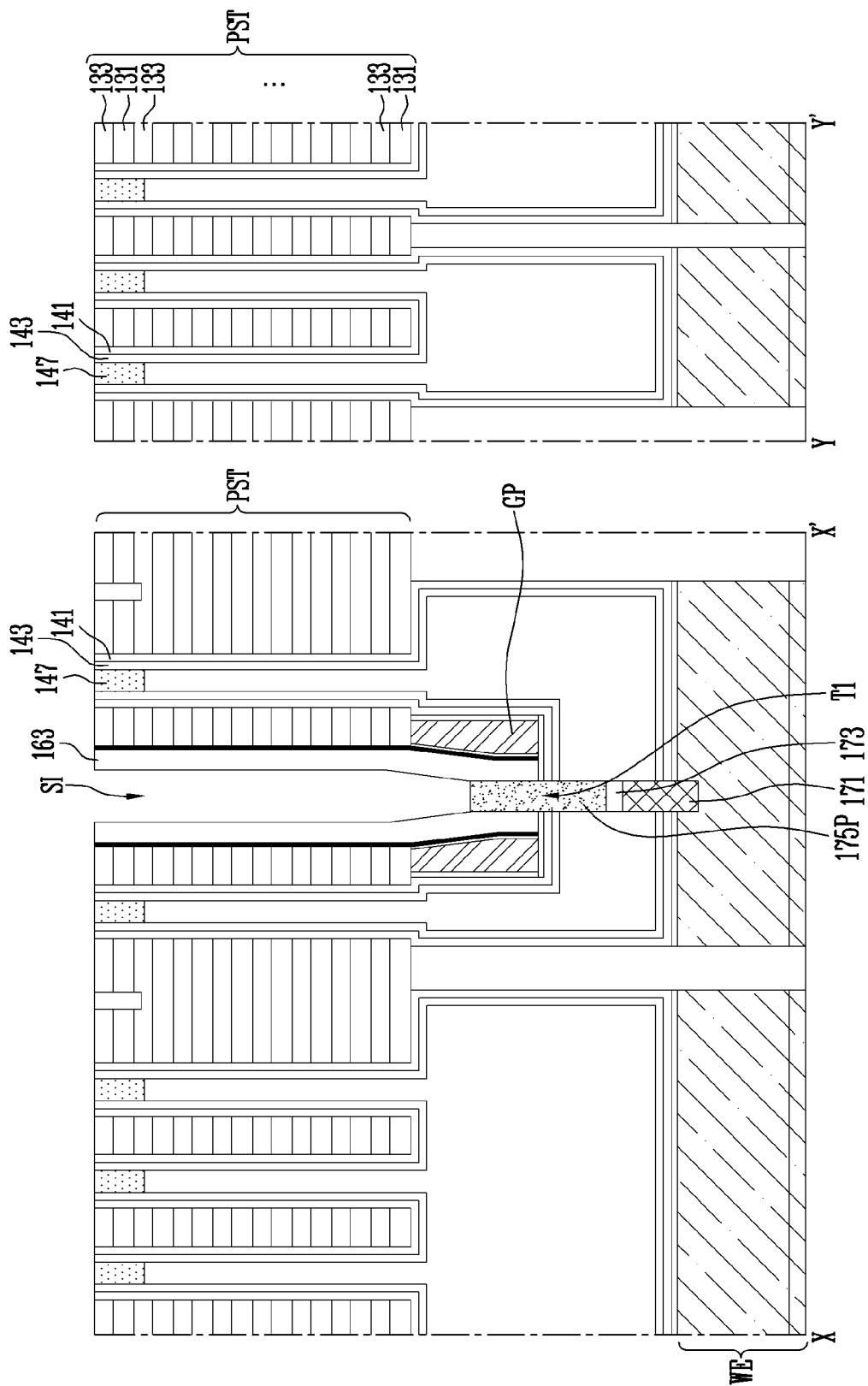

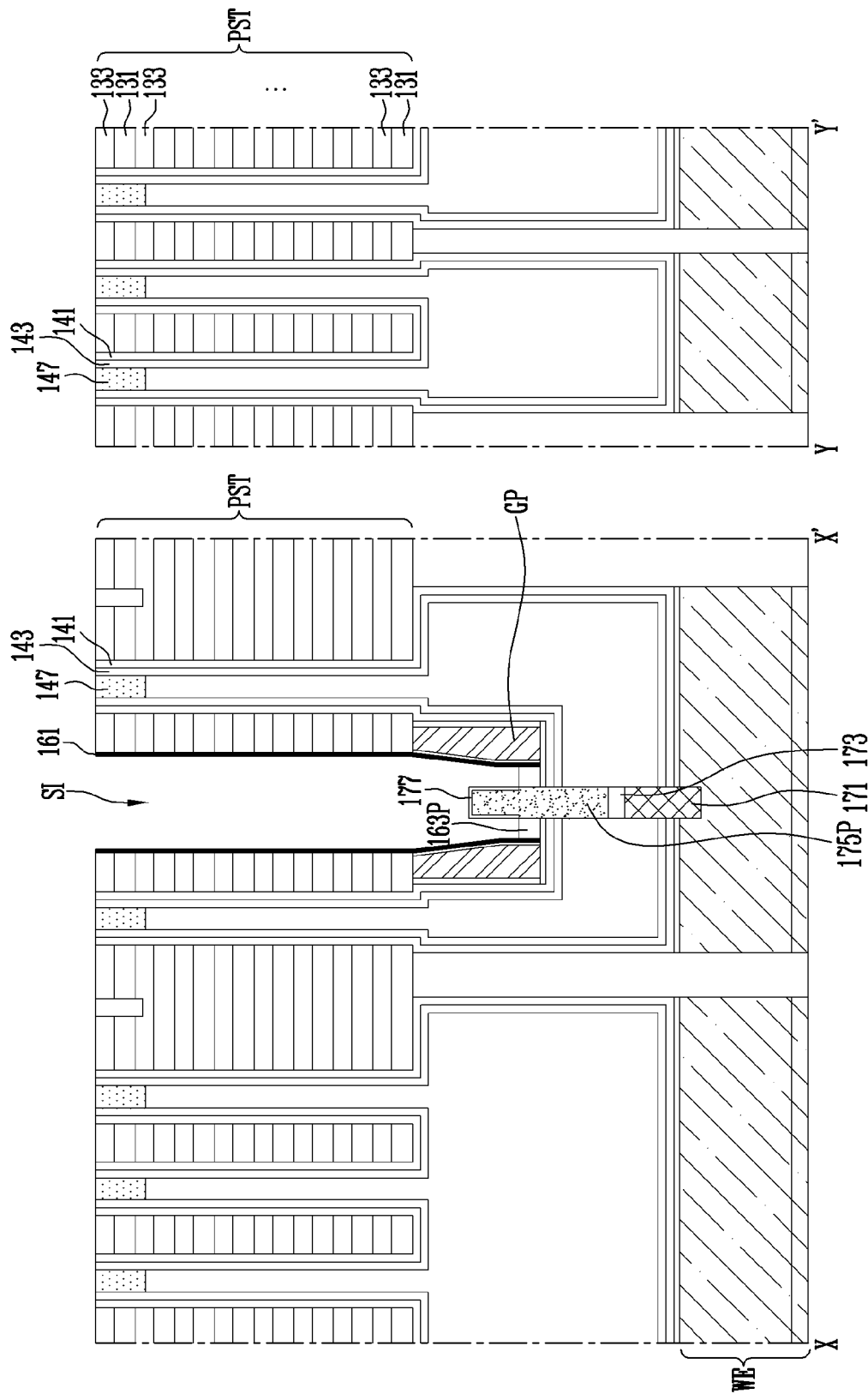

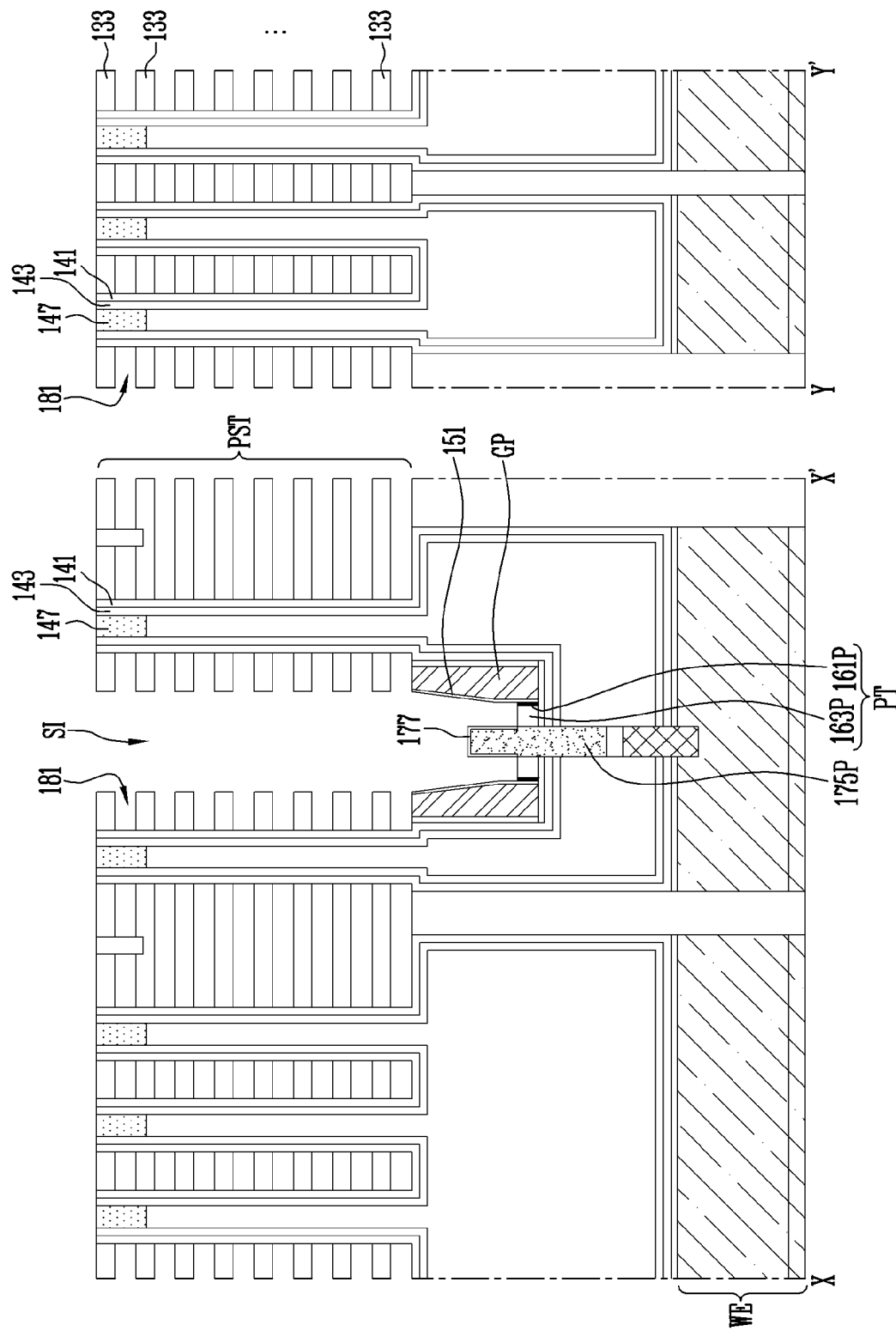

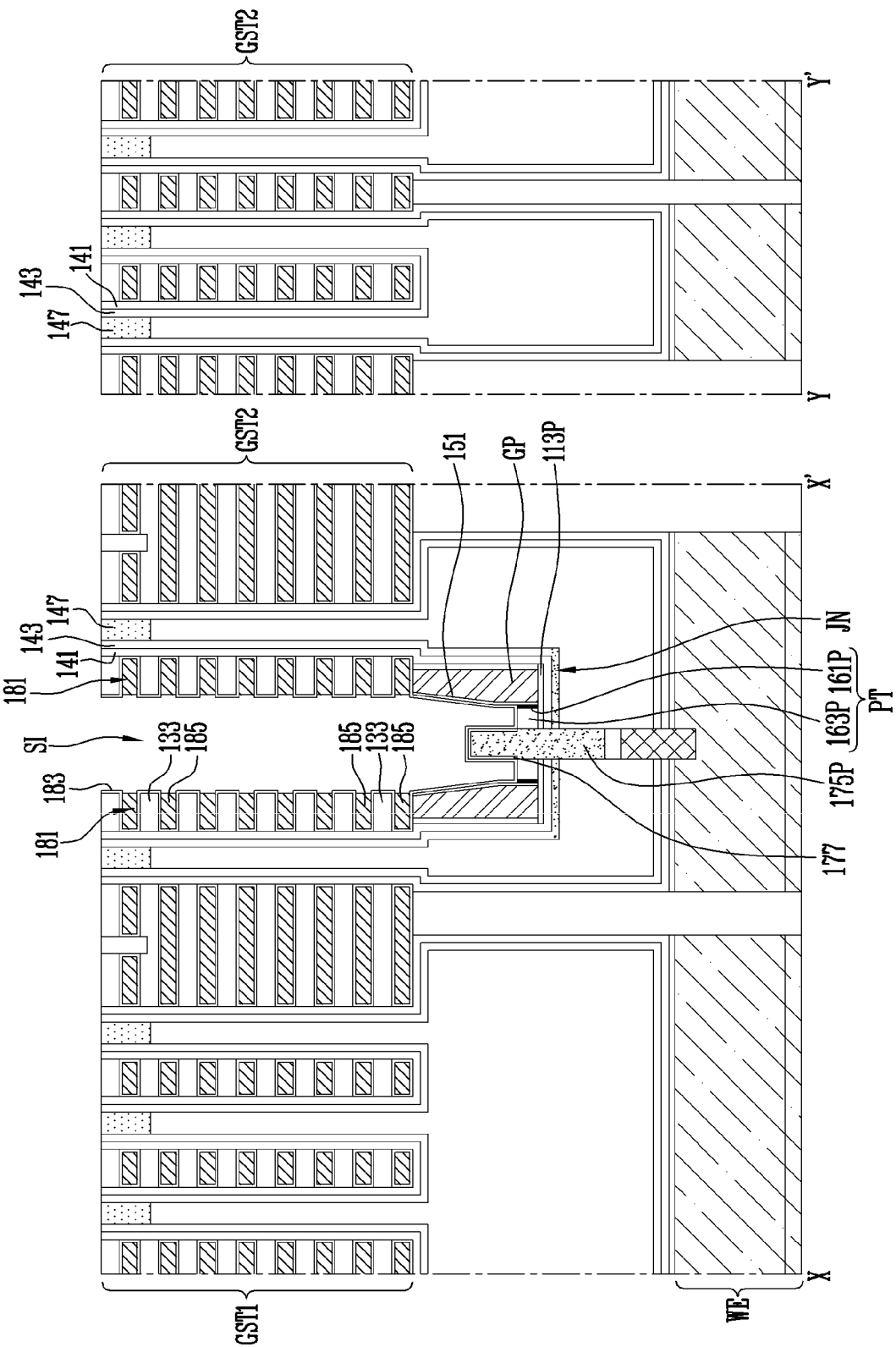

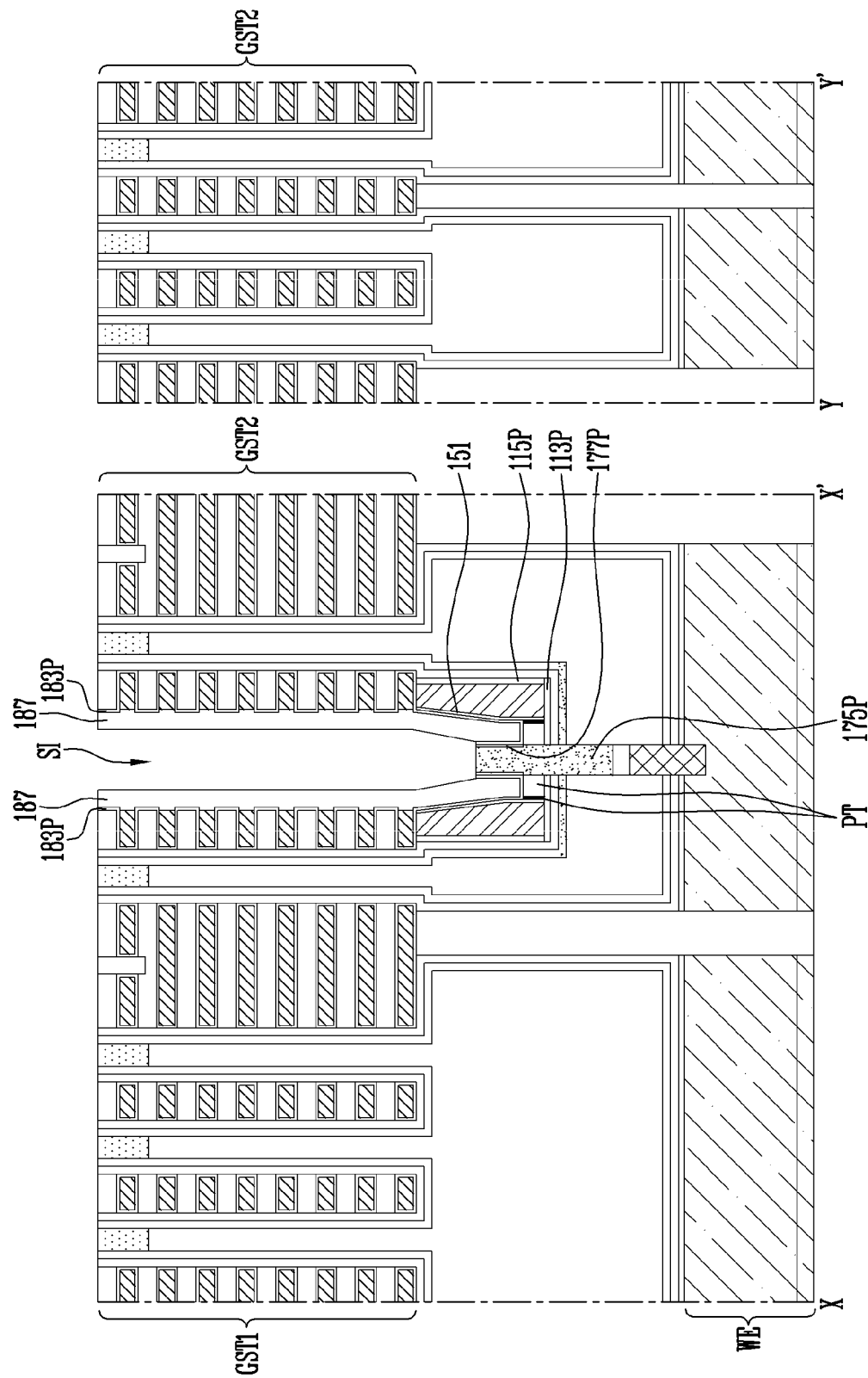

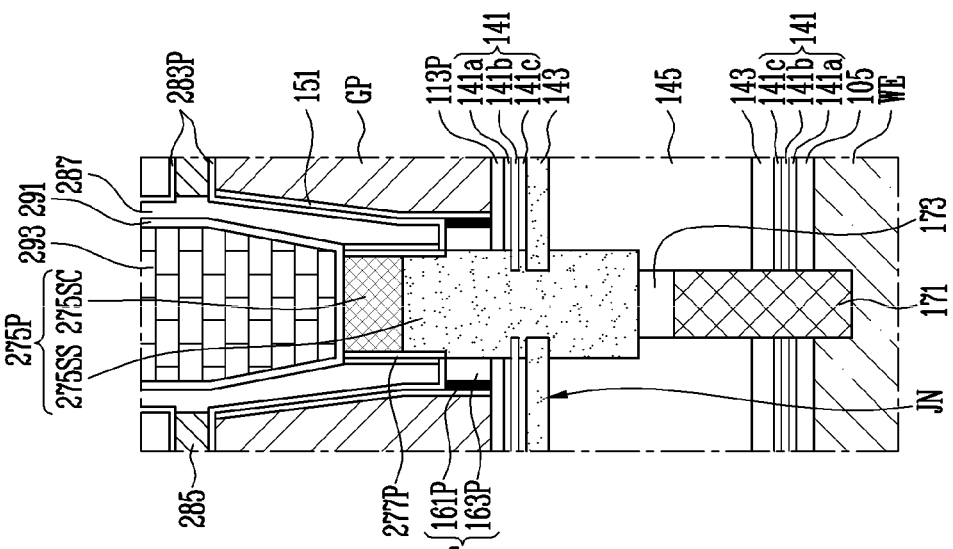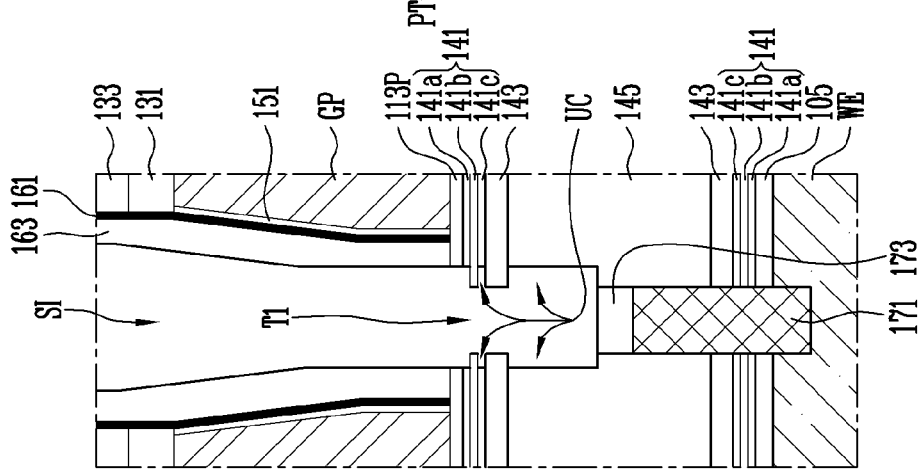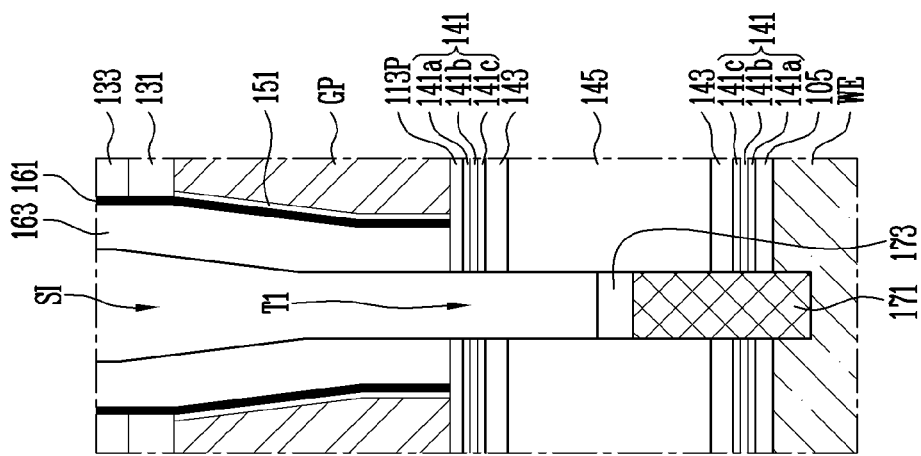

SEMICONDUCTOR DEVICE AND MANUFACTURING METHOD OF SEMICONDUCTOR DEVICE

CROSS-REFERENCE TO RELATED APPLICATION

The present application claims priority under 35 U.S.C. § 119(a) to Korean patent application number 10-2018-0038830 filed on Apr. 3, 2018, in the Korean Intellectual Property Office, the entire disclosure of which is incorporated herein by reference.

BACKGROUND

1. Technical Field

The present disclosure generally relates to a semiconductor device and a manufacturing method thereof, and more particularly, to a three-dimensional semiconductor device and a manufacturing method of the semiconductor device.

2. Related Art

A semiconductor device includes a plurality of memory cell transistors capable of storing data. The memory cell transistors may be connected in series between select transistors to form a memory string. A three-dimensional semiconductor device has been proposed to achieve a high degree of integration of semiconductor devices. Gate patterns of memory cell transistors and select transistors may be stacked on each other to form a three-dimensional semiconductor device. In implementing such three-dimensional semiconductor devices, various techniques for improving the operational reliability of the semiconductor devices have been developed.

SUMMARY

In accordance with the present disclosure, a semiconductor device includes a source contact structure extending along a first direction. The semiconductor device also includes a first gate stack structure disposed on a first side of the source contact structure, the first gate stack structure including a side region adjacent to the first side of the source contact structure and including a center region, opposite the source contact structure, extending from the side region of the first gate stack structure. The semiconductor device further includes a first source gate pattern disposed under the side region of the first gate stack structure, the first source gate pattern comprising an inclined surface facing the source contact structure. The semiconductor device additionally includes a first channel pattern extending along an underside of the center region of the first stack structure, penetrating the center region of the first stack structure, and extending toward and contacting the first side of the source contact structure.

Also in accordance with the present disclosure, a semiconductor device includes source contact structures; source gate patterns disposed between the source contact structures and spaced apart from each other; a gate stack structure disposed between the source contact structures, the gate stack structure including side regions aligned above the source gate patterns and a center region between the side regions; a spacer insulating layer disposed between each of the source contact structures and the gate stack structure; a protective pattern aligned under the spacer insulating layer, the protective pattern being disposed between the source contact structure and the source gate pattern; and a channel pattern penetrating the gate stack structure, extending along a bottom surface of the gate stack structure, extending along surfaces of the source gate patterns, and extending along a bottom surface of the protective pattern, the channel pattern having source contact surfaces in contact with the source contact structures.

Further in accordance with the present disclosure, a method of manufacturing a semiconductor device includes: forming supports penetrating a well structure, the supports protruding upward from the well structure; forming a stack structure on the supports, the stack structure penetrated by holes and having an etch stop pattern disposed on a portion of a bottom surface of the stack structure which facing the well structure; forming a multi-layered memory layer on a surface of an opening region including a horizontal space opened between the well structure and the stack structure and the holes; forming a channel layer on a surface on the multi-layered memory layer; forming a gap fill insulating layer on the channel layer, the gap fill insulating layer filling the opening region; and forming a slit penetrating the etch stop pattern from the stack structure, the slit separating the etch stop pattern into source gate patterns, wherein the slit is formed such that each of the source gate patterns has a surface inclined toward the slit.

Additionally in accordance with the present disclosure, a method of manufacturing a semiconductor device includes: forming supports penetrating a well structure, the supports protruding upward from the well structure; forming a stack structure on the supports, the stack structure penetrated by holes and having an etch stop pattern disposed on a portion of a bottom surface of the stack structure facing the well structure; forming a multi-layered memory layer on a surface of an opening region including a horizontal space opened between the well structure and the stack structure and the holes; forming a channel layer on a surface on the multi-layered memory layer; forming a gap fill insulating layer on the channel layer, the gap fill insulating layer filling the opening region; forming a slit penetrating the etch stop pattern from the stack structure, the slit separating the etch stop pattern into source gate patterns; forming a protective layer on a sidewall of the slit; forming a first trench penetrating the multi-layered memory layer and the channel layer not blocked by the protective layer, the first trench extending to the inside of the gap fill insulating layer; forming a doped semiconductor pattern extending from the inside of the first trench to between the source gate patterns; and forming a protective pattern exposing a first part of the doped semiconductor pattern by etching the protective layer.

BRIEF DESCRIPTION OF THE DRAWINGS

Example embodiments are described with reference to the accompanying drawings. These embodiments, however, they may be realized in different forms and should not be construed as being limited to the presented embodiments set forth herein. The presented embodiments are provided so that this disclosure is enabling to those skilled in the art.

In the drawings, dimensions may be exaggerated for clarity of illustration. It will be understood that when an element is referred to as being "between" two other elements, it may be the only element between the other two elements, or one or more intervening elements may also be present between the other two elements. Like reference numerals refer to like elements throughout the drawings.

FIGS. 4A and 4B show plan views illustrating a layout of supports, pillar parts of channel patterns, and a source contact structure.

FIGS. 6A to 6G show sectional views illustrating an embodiment of subsequent processes continued after a process shown in FIG. 5P.

FIGS. 7A to 7C show sectional views illustrating an embodiment of the subsequent processes continued after a process shown in FIG. 5P.

DETAILED DESCRIPTION

The technical spirit of the present disclosure may be changed in various manners and may be implemented as embodiments having various aspects. Hereinafter, the present disclosure will be described by a limited number of possible embodiments so that those skilled in the art can implement the present disclosure in practice.

Although the terms "first" and/or "second" are used herein to describe various elements, the elements should not be limited by these terms. The terms are only used to distinguish one element from another element, not to indicate a number or priority of elements. For instance, a first element discussed below could be termed a second element, and a second element could be termed a first element without departing from the teachings of the present disclosure.

When one element is referred to as being "coupled" or "connected" to another element, the one element can be directly coupled or connected to the other element or intervening elements may be present between the "coupled" or "connected". In contrast, when an element is referred to as being "directly coupled" or "directly connected" to another element, there are no intervening elements present between the "directly coupled" or "directly connected" elements. Other expressions that explain a relationship between elements, such as "between," "directly between," "adjacent to," or "directly adjacent to" should be construed in the same way.

The terminology used herein is for the purpose of describing particular embodiments only and is not intended to be limiting. In the present disclosure, singular forms are intended to include the plural forms as well, unless the context clearly indicates otherwise. It will be further understood that the terms "comprise," "include," "have," etc., when used in this specification, specify the presence of stated features, numbers, steps, operations, elements, components, and/or combinations thereof but do not preclude the presence or addition of one or more other features, numbers, steps, operations, elements, components, and/or combinations thereof.

Presented embodiments relate to three-dimensional semiconductor devices having improved operational reliability and the manufacturing of such semiconductor devices.

Figure 1A:
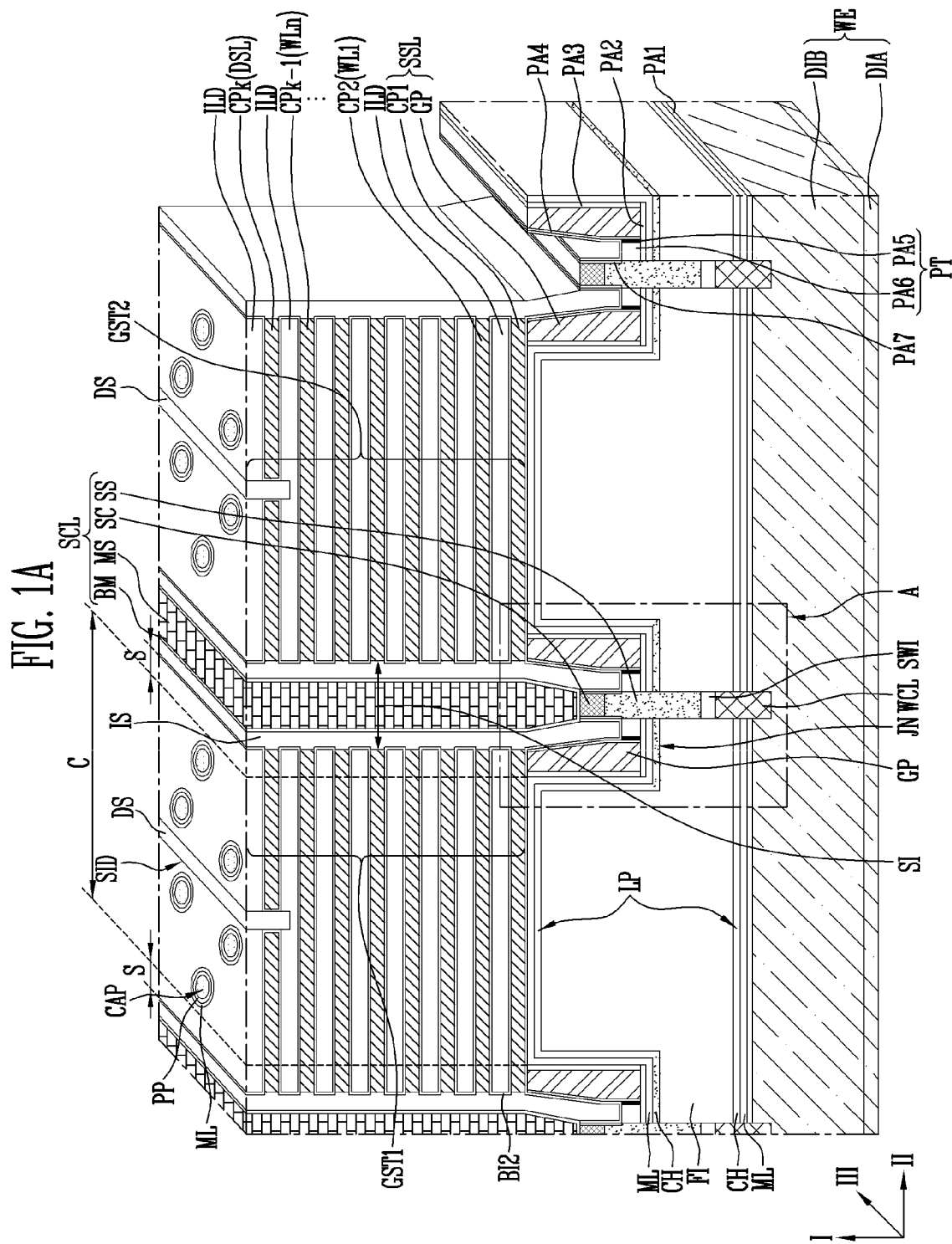
FIGS. 1A and 1B show a perspective view and an enlarged sectional view illustrating a semiconductor memory device, according to an embodiment of the present disclosure.
Figure 1B:
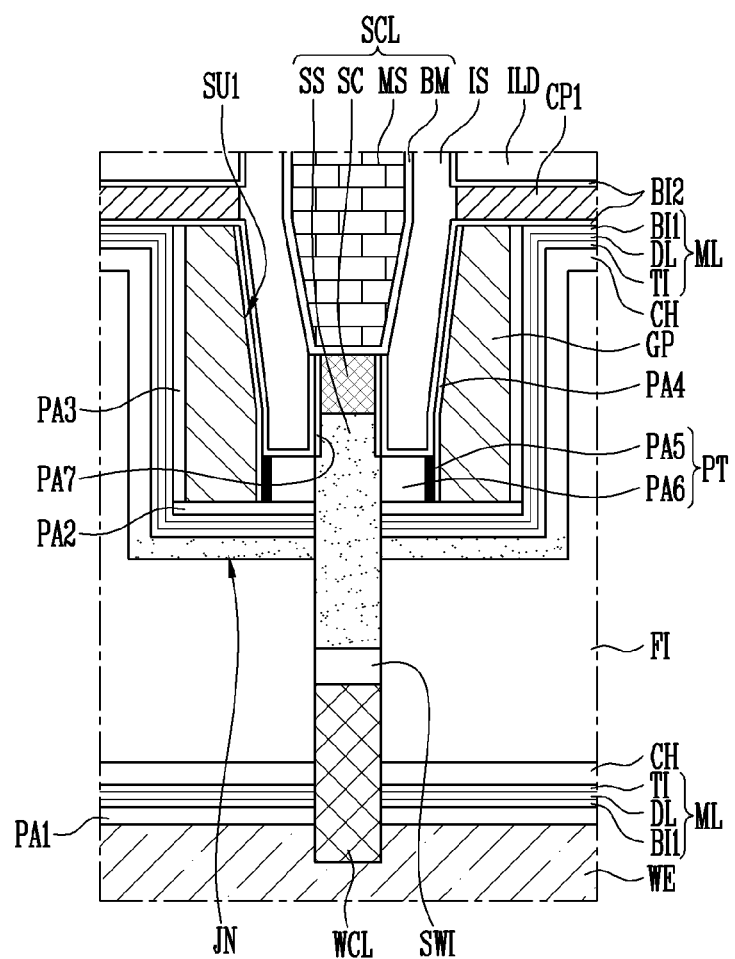
Figure 2:
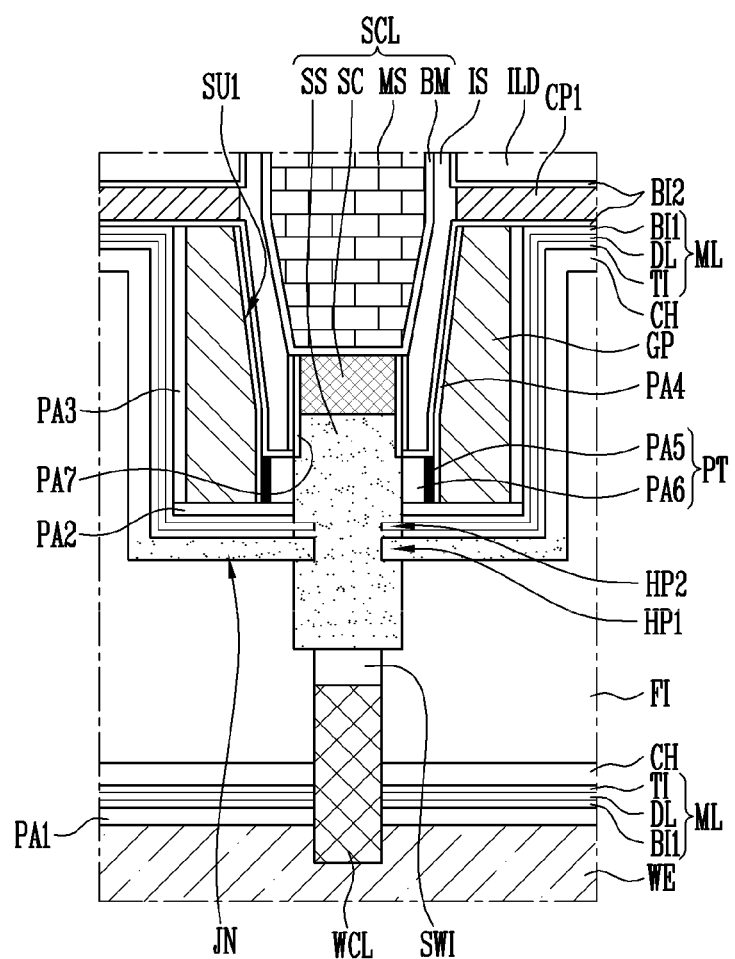
FIG. 2 shows a sectional view illustrating a semiconductor device, according to an embodiment of the present disclosure.

FIG. 1A shows a perspective view illustrating a semiconductor device, according to an embodiment of the present disclosure. FIG. 1B shows an enlarged sectional view of region A shown in FIG. 1A. For convenience of description, some components are omitted from FIG. 1A. FIG. 2 shows a sectional view illustrating a semiconductor device according to an embodiment of the present disclosure, which is an enlarged view of a portion corresponding to the region A shown in FIG. 1A.

Referring to FIGS. 1A to 2, each of the semiconductor devices may include a well structure WE including a dopant of a first conductivity type, gate stack structures GST1 and GST2 disposed above the well structure WE, channel patterns CH extending to a space between the well structure WE and the gate stack structures GST1 and GST2 from the inside of the gate stack structures GST1 and GST2, source gate patterns GP disposed under each of the gate stack structures GST1 and GST2 to be spaced apart from each other, well contact structures WCL connected to the well structure WE, slits SI separating the gate stack structures GST1 and GST2 from each other, and source contact structures SCL disposed in the slits SI to be connected to the channel patterns CH. Semiconductor devices according to embodiments of the present disclosure may further include at least one of first to seventh protective layers PA1 to PA7. The first to seventh protective layers PA1 to PA7 may be formed to protect specific material layers during manufacturing of semiconductor devices.

The well structure WE may include a first doped semiconductor layer including a dopant of the first conductivity type. The first doped semiconductor layer may include at least one layer. For example, the well structure WE may be formed in a structure in which a first doped silicon layer DIA including the dopant of the first conductivity type with a first concentration and a second doped silicon layer DIB including the dopant of the first conductivity type with a second concentration are stacked. The first doped silicon layer DIA may include the dopant of the first conductivity type with the first concentration higher than the second concentration. The dopant of the first conductivity type may be a p-type dopant. Although not shown in the drawings, a driving circuit may be formed on a substrate to overlap with the well structure WE under the well structure WE. The well structure WE is disposed under the source gate patterns GP, and may extend to overlap with the gate stack structures GST1 and GST2 and the source contact structures SCL.

The gate stack structures GST1 and GST2, the channel patterns CH, the source gate patterns GP, and the source contact structures SCL are disposed above the well structure WE. Each of the gate stack structures GST1 and GST2, the source gate patterns GP, and the source contact structures SCL is disposed in a first direction I to be spaced apart from the well structure WE.

A stack structure including horizontal conductive patterns CP1 to CPk and interlayer insulating layers ILD, which are alternately stacked in the first direction I, may be separated into the gate stack structures GST1 and GST2 through the slits SI. Although FIG. 1A illustrates a first gate stack structure GST1 and a second gate stack structure GST2, the number of gate stack structures separated by the slits SI may be two or more.

Each of the gate stack structures GST1 and GST2 is disposed between the source contact structures SCL adjacent to each other in a second direction II. The second direction II is a direction intersecting the first direction I. The source contact structures SCL extend along the first direction I to face sidewalls of the gate stack structures GST1 and GST2 and sidewalls of the source gate patterns GP. Each of the source contact structures SCL is disposed in a slit SI corresponding thereto. The source contact structures SCL may extend farther toward the well structure than the source gate patterns GP. According to the above-described structure, the gate stack structures GST1 and GST2 may be disposed at both sides of each of the source contact structure SCL. For example, the first gate stack structure GST1 and the second gate stack structure GST2 may be disposed on a first side and a second side, respectively, of a source contact structure SCL.

Each of the gate stack structures GST1 and GST2 may be divided into side regions S and a center region C. The side regions S are regions adjacent to the slits SI and the source contact structures SCL. The center region C is a region that is disposed between the side regions S and extends from the side regions S.

The source gate patterns GP are disposed between the source contact structures SCL adjacent to each other, and are spaced apart from each other in the second direction II. The source gate patterns GP are aligned under the side regions S of each of the gate stack structures GST1 and GST2. Each of the source gate patterns GP has a first surface SU1 adjacent to one of the source contact structures SCL. The first surface SU1 is an inclined surface facing a source contact structure adjacent thereto. The distance between the source gate patterns GP is widened by the first surface SU1 when reaching an upper portion thereof, which faces the gate stack structures GST1 and GST2. In other words, the distance between first surfaces SU1 between adjacent source gate patterns GP across the source contact structure SCL decreases with increasing the distance below the gate stack structures GST1 and GST2 as shown in FIGS. 1A, 1B, and 2. Namely, a width of each of source gate patterns GP decreases with decreasing the distance below the gate structures GST1 and GST2.

The source gate patterns GP and the horizontal conductive patterns CP1 to CPk correspond to gate lines SSL, WL1 to WLn, and DSL used as gate electrodes of transistors. The source gate patterns GP may be formed of a conductive material different from that of the horizontal conductive patterns CP1 to CPk. The source gate patterns GP may be formed of a material selected by considering an etch rate, to serve as etch stop layers while a manufacturing process of the semiconductor device is being performed. For example, the source gate patterns GP may be formed of doped silicon layers. The source gate patterns GP may include an n-type dopant. The source gate patterns GP may be formed thick in the manufacturing process, to serve as etch stop layers. For example, each of the source gate patterns GP may be formed thicker in the first direction I than each of the horizontal conductive patterns CP1 to CPk.

The horizontal conductive patterns CP1 to CPk may be formed of the same conductive material. The horizontal conductive patterns CP1 to CPk may be formed of a conductive material different from that of the source gate patterns GP. The horizontal conductive patterns CP1 to CPk may be formed of a conductive material having a resistance lower than that of the source gate patterns GP. For example, each of the horizontal conductive patterns CP1 to CPk may include at least one of a metal layer and a metal silicide layer. The horizontal conductive patterns CP1 to CPk may include tungsten having a low resistance.

The source gate patterns GP are disposed between the gate stack structures GST1 and GST2 and the well structure WE and are spaced apart from the well structure WE. The source gate patterns GP are used as source select lines SSL. The source gate patterns GP respectively overlap with the side regions S of the gate stack structures GST1 and GST2, and do not overlap with the center regions C of the gate stack structures GST1 and GST2. When each of the source gate patterns GP is formed of doped silicon layer, the doped silicon layer may serve as an etch stop layer but increases the resistance of the source select line. According to some embodiments of the present disclosure, each of the source gate patterns GP does not overlap with the entire surface of the gate stack structure GST1 or GST2 as a whole and only overlaps with the side region S of the gate stack structure GST1 or GST2 corresponding thereto. In other words, each of the source gate patterns GP does not overlap with the center region C of the gate stack structure GST1 or GST2. Accordingly, for some embodiments of the present disclosure, an increase in the resistance of the source select line SSL due to the source gate pattern GP can be reduced.

A first horizontal conductive pattern CP1 disposed closest to the source gate patterns GP among the horizontal conductive patterns CP1 to CPk is used as a source select line SSL connected to a gate electrode of a source select transistor. The first horizontal conductive pattern CP1 and a pair of source gate patterns GP overlapping with the bottom thereof may be electrically connected to each other to constitute one source select line SSL.

In order to electrically connect the first horizontal conductive pattern CP1 and the source gate patterns GP to each other, contact plugs (not shown) may be respectively connected to the first horizontal conductive pattern CP1 and the source gate patterns GP, and be commonly connected using a metal line. Alternatively, the first horizontal conductive pattern CP1 and the source gate patterns GP may operate by a capacitive coupling between the first horizontal conductive pattern CP1 and the source gate patterns GP. That is, although a voltage is applied to any one of the first horizontal conductive pattern CP1 and the source gate patterns GP, the voltage may be applied to both of the first horizontal conductive pattern CP1 and the source gate patterns GP, using a coupling phenomenon.

An uppermost horizontal conductive pattern CPk disposed most distant from the source gate patterns GP among the horizontal conductive patterns CP1 to CPk may be used as a drain select line DSL connected to a gate electrode of a drain select transistor. Horizontal conductive patterns CP2 to CPk−1 between the drain select line DSL and the source select line SSL may be used as word lines WL1 to WLn connected to gate electrodes of memory cell transistors.

Although FIG. 1A illustrates a case where the first horizontal conductive pattern CP1 is used as the source select line SSL and the uppermost horizontal conductive pattern CPk is used as a drain select line DSL, the present disclosure is not limited thereto. For example, one or more horizontal conductive patterns consecutively disposed in the upper direction from the first horizontal conductive pattern CP1 among the horizontal conductive patterns CP1 to CPk may be used as source select lines SSL, and one or more horizontal conductive patterns consecutively disposed in the lower direction from the uppermost horizontal conductive pattern CPk among the horizontal conductive patterns CP1 to CPk may be used as drain select lines DSL. The word lines WL1 to WLn are stacked between the source select line SSL and the drain select line DSL to be spaced apart from each other.

The source select line SSL and the word lines WL1 to WLn may be disposed between the slits SI adjacent to each other. A drain separation slit SID may be further disposed between the slits SI adjacent to each other. The drain separation slit SID extends to penetrate the horizontal conductive pattern (e.g., CPk) used as the drain select line DSL. The drain separation slit SID is filled with a drain separation insulating layer DS. The drain select lines DSL disposed in the same layer between the slits SI adjacent to each other are separated from each other by the drain separation insulating layer DS. The depth of the drain separation slit SID and the drain separation insulating layer DS may be controlled not to penetrate the source select line SSL and the word lines WL1 to WLn.

The interlayer insulating layers ILD may be respectively disposed between the horizontal conductive patterns CP1 to CPk adjacent to each other in the first direction I. The interlayer insulating layers ILD may be formed of an insulating material such as oxide.

Spacer insulating layers IS are disposed on sidewalls of the slits SI. The spacer insulating layers IS are respectively disposed between the source contact structures SCL and the gate stack structures GST1 and GST2. The spacer insulating layers IS extend between the source contact structures SCL and the source gate patterns GP. The source gate patterns GP and the source contact structures SCL extend farther toward the well structure WE than the spacer insulating layers IS. The source contact structures SCL may be insulated from the gate stack structures GST1 and GST2 and the source gate patterns GP by the spacer insulating layers IS.

A protective pattern PT may be aligned under each of the spacer insulating layers IS. The protective pattern PT may include protective layers PA5 and PA6 remaining between the source contact structure SCL and the source gate pattern GP, which are adjacent to each other. More specifically, the protective pattern PT may include a fifth protective layer PA5 and a sixth protective layer PA6. The sixth protective layer PA6 is disposed between the source gate patterns GP and the source contact structure SCL, and may be formed of an oxide layer. The fifth protective layer PA5 is disposed between the sixth protective layer PA6 and the source contact structure SCL, and may be formed of a nitride layer.

The source contact structures SCL include a dopant of a second conductivity type different from the first conductivity type. The dopant of the second conductivity type may be an n-type dopant. More specifically, each of the source contact structures SCL may include a semiconductor pattern SS including the dopant of the second conductivity type.

The doped semiconductor pattern SS may be formed by etching a second doped semiconductor layer. For example, the second doped semiconductor layer may be an n-type doped silicon layer. The doped semiconductor pattern SS may be in contact with the channel patterns CH to define a source contact surface, and supply the dopant of the second conductivity type to the inside of the channel patterns CH. The doped semiconductor pattern SS is disposed between the protective patterns PT adjacent to each other. The doped semiconductor pattern SS may extend farther toward the well structure WE than the source gate patterns GP and the protective patterns PT. The doped semiconductor pattern SS may extend between the spacer insulating layers IS adjacent to each other. The sixth protective layer PA6 is disposed between each of the source gate patterns GP and the doped semiconductor pattern SS, and the fifth protective layer PA5 is disposed between the sixth protective layer PA6 and the doped semiconductor pattern SS.

Each of the source contact structures SCL may further include a plurality of conductive layers connected to the doped semiconductor pattern SS. For example, each of the source contact structures SCL may further include a metal silicide layer SC, a metal layer MS, and a metal barrier layer BM. The metal layer MS extends to face the sidewalls of the gate stack structures GST1 and GST2, and is disposed in a slit SI corresponding thereto. The metal layer MS may extend farther toward the well structure WE than the gate stack structures GST1 and GST2. The metal silicide layer SC is aligned between the metal layer MS and the doped semiconductor pattern SS. The metal barrier layer BM extends along an interface between the metal silicide layer SC and the metal layer MS and an interface between the spacer insulating layer IS and the metal layer MS. The metal silicide layer SC and the metal layer MS may have a resistance lower than that of the doped semiconductor pattern SS, and decrease the resistance of the source contact structure SCL. The metal silicide layer SC may include tungsten silicide, nickel silicide, etc. The metal layer MS may include tungsten, etc. The metal barrier layer BM prevents or limits diffusion of metal, and may include a titanium nitride layer, a tungsten nitride layer, a tantalum nitride layer, etc.

Each of the spacer insulating layers IS extends along a sidewall of a metal silicide layer SC, and extends along an interface between each of the source gate patterns GP and the doped semiconductor pattern SS. A first part of the doped semiconductor pattern SS, which protrudes upward from the protective pattern PT, and the sidewall of the metal silicide layer SC may be covered with the seventh protective layer PA7. The seventh protective layer PA7 may serve as an etching protective layer for preventing loss of the doped semiconductor pattern from an etching process during the manufacturing of the semiconductor device. The seventh protective layer PA7 may be an oxide layer. The seventh protective layer PA7 extends from between each of the spacer insulating layers IS and the metal silicide layer SC to between each of the spacer insulating layers IS and the doped semiconductor pattern SS.

The well structure WE disposed under the gate stack structures GST1 and GST2 may extend along second and third directions II and III intersecting the first direction I to overlap with the source gate patterns GP and the source contact structures SCL. For some embodiments, the third direction III is normal to the first I and second II directions. For example, the first I, second II, and third II directions might define an orthogonal coordinate system. Although not shown in the drawings, a space between the gate stack structures GST1 and GST2 and the well structure WE may be supported by supports. The structure of the supports is described in more detail later with reference to FIGS. 3, 4A, and 4B.

The well contact structures WCL are aligned under the source contact structures SCL. The well contact structures WCL extend toward and are in contact with the well structure WE. In other words, the well contact structures WCL is in contact with the channel patterns CH, which extend toward the source contact structures SCL. The well contact structures WCL may be in contact with the channel patterns CH to define a well contact surface. The channel patterns CH may be electrically connected to the well structure WE via the well contact structures WCL. The well contact structures WCL may be formed of a conductive material. For example, the well contact structures WCL may be formed of a silicon layer.

Inter-well-source insulating layers SWI may be further disposed between the well contact structures WCL and the source contact structures SCL. Each of the inter-well-source insulating layers SWI extends in the third direction III.

Each of the channel patterns CH may include pillar parts PP and a connecting part LP. The pillar parts PP penetrate the center region C of the gate stack structure GST1 or GST2, and the connecting part LP is disposed under the gate stack structure GST1 or GST2 to connect the pillar parts PP. The pillar parts PP are surrounded by the horizontal conductive patterns CP1 to CPk and the interlayer insulating layers ILD. The connecting part LP extends to a space between the well structure WE and the gate stack structure GST1 or GST2. The connecting part LP extends from the pillar parts PP. The connecting part LP extends along a bottom surface of the gate stack structure GST1 or GST2. The connecting part LP extends along surfaces of the source gate patterns GP. The connecting part LP extends along a bottom surface of the protective pattern PT, and extends along sidewalls of the supports which are described later. The connecting part LP also extends along an upper surface of the well structure WE. The pillar parts PP and the connecting part LP may be integrally formed. The integrated channel pattern CH including the pillar parts PP and the connecting part LP is described in more detail later with reference to FIG. 3.

An outer surface of each of the channel patterns CH may be surrounded by a multi-layered memory pattern ML, and each of the channel patterns CH may surround an insulating pattern FI.

The insulating pattern FI penetrates the center region C of each of the gate stack structures GST1 and GST2 while being surrounded by the pillar parts PP, and extends to fill in a space between each of the gate stack structures GST1 and GST2 and the well structure WE. The insulating pattern FI may fill in the space between each of the gate stack structures GST1 and GST2 and the well structure WE and a space between the source gate patterns GP. The insulating pattern FI may include a concave groove part corresponding to the each of the source gate patterns GP. The insulating pattern FI may be formed with a height lower than that of the pillar parts PP. Capping patterns CAP surrounded by the pillar parts PP may be disposed on the insulating pattern FI. The structure of the insulating pattern FI, the pillar parts PP, and the capping patterns CAP are described in more detail later with reference to FIG. 3.

Each of the capping patterns CAP may be formed of a semiconductor layer including a dopant of the second conductivity type. For example, each of the capping patterns CAP may be formed of a doped silicon layer doped with an n-type dopant. Each of the capping patterns CAP may be used as a drain junction.

The multi-layered memory pattern ML extends along the outer surface of each of the channel patterns CH. A portion of the multi-layered memory pattern ML, which is disposed between each of the channel patterns CH and the drain select line DSL, and a portion of the multi-layered memory patterns ML, which is disposed between each of the channel patterns CH and the source select line SSL, may be used as a gate insulating layer. The multi-layered memory pattern ML extends along an interface between the channel pattern CH corresponding thereto and the well structure WE, an interface between the channel pattern CH corresponding thereto and the source gate patterns GP, and an interface between the gate stack structure GST1 or GST2 corresponding thereto and the channel pattern CH, and overlaps with the spacer insulating layer IS under the spacer insulating layer IS.

Layers constituting the multi-layered memory pattern ML are illustrated in detail in FIGS. 1B and 2. The multi-layered memory pattern ML may include a tunnel insulating layer TI, a data storage layer DL, and a first blocking insulating layer BI1, which surround the channel pattern CH. The tunnel insulating layer TI is disposed between the data storage layer DL and the channel pattern CH. The data storage layer DL and the tunnel insulating layer TI are disposed between the first blocking insulating layer BI1 and the channel pattern CH. The data storage layer DL may store data changed using Fowler-Nordheim tunneling caused by a difference in voltage between the channel pattern CH and the word lines WL1 to WLn shown in FIG. 1A. To this end, the data storage layer DL may be formed of various materials. For example, the data storage layer DL may be formed of a nitride layer in which charges can be trapped. In addition, the data storage layer DL may include silicon, a phase change material, nanodots, and the like. The first blocking insulating layer BI1 may include an oxide layer capable of blocking charges. The tunnel insulating layer TI may include a silicon oxide layer.

A second blocking insulating layer BI2 may be further formed along interfaces between the interlayer insulating layers ILD and the horizontal conductive patterns CP1 to CPk. The second blocking insulating layer BI2 may extend along an interface between the spacer insulating layer IS and the source gate pattern GP, which are adjacent to each other, an interface between each of the spacer insulating layers IS and the first part of the doped semiconductor pattern SS, which extends farther than the protective pattern PT, and an interface between each of the spacer insulating layers IS and the metal silicide layer SC. The second blocking insulating layer BI2 may extend along interfaces between the multi-layered memory pattern ML and the horizontal conductive patterns CP1 to CPk. Also, the second blocking insulating layer BI2 may extend between the spacer insulating layers IS and the interlayer insulating layers ILD. The second blocking insulating layer BI2 may be formed of an insulating layer having a dielectric constant higher than that of the first blocking insulating layer BI1 constituting the multi-layered memory pattern ML. For example, the second blocking insulating layer BI2 may be formed of an aluminum oxide layer. Although not shown in the drawings, a barrier layer for preventing direct contact between each of the horizontal conductive patterns CP1 to CPk and the second blocking insulating layer BI2 may be further formed at an interface between each of the horizontal conductive patterns CP1 to CPk and the second blocking insulating layer BI2. The barrier layer may include a titanium nitride layer, a tungsten nitride layer, a tantalum nitride layer, and the like.

In a process of manufacturing the semiconductor device, a first protective layer PA1 for protecting the well structure WE, and second to fourth protective layers PA2 to PA4 for protecting the source gate patterns GP may be formed, and at least one of the second to fourth protective layers PA2 to PA4 may remain. The first protective layer PA1 may remain between the well structure WE and the multi-layered memory pattern ML. The second protective layer PA2 may remain between a bottom surface of each of the source gate patterns GP and the multi-layered memory pattern ML. The third protective layer PA3 may remain between a sidewall of each of the source gate patterns GP and the multi-layered memory pattern ML. The fourth protective layer PA4 may remain between the sidewall of the source gate patterns GP and the second blocking insulating layer BI2. The second to fourth protective layers PA2 to PA4 may be oxide layers.

Each of the channel patterns CH includes a source contact surface that is in direct contact with the doped semiconductor pattern SS of each of the source contact structures SCL. The source contact surface and the doped semiconductor pattern SS may be formed in various structures.

Referring to FIG. 1B, the doped semiconductor pattern SS extends in a linear shape from between the spacer insulating layers IS to between the insulating patterns FI, and may be in contact with a portion of each of the channel patterns CH extending along upper surfaces of the insulating patterns FI. The source contact surface of each of the channel patterns CH in contact with the doped semiconductor pattern SS may have a linear shape.

Alternatively, referring to FIG. 2, at least one groove part may be formed a sidewall of the doped semiconductor pattern SS. The groove part formed at the sidewall of the doped semiconductor pattern SS may be filled with a first extension part HP1 of each of the channel patterns CH, or may be filled with a second extension part HP2 of the data storage layer DL. The first extension part HP1 is a part of each channel patterns CH, which is formed to penetrate into the doped semiconductor pattern SS of the source contact structure SCL, and may increase the area of the source contact surface in contact with the source contact structure SCL. The second extension part HP2 is a portion of the data storage layer DL, which remains by penetrating into the doped semiconductor pattern SS of the source contact structure SCL in the process of manufacturing the semiconductor device. According to the above-described structure, the first extension part HP1 and the second extension part HP2 extend farther toward the source contact structure SCL than the first blocking insulating layer BI1 and the tunnel insulating layer TI. Also, the first extension part HP1 and the second extension part HP2 are formed in a structure in which they are inserted into a groove defined at a sidewall of the source contact structure SCL.

Referring to FIGS. 1A, 1B, and 2, each of the channel patterns CH includes a well contact surface that is in direct contact with each of the well contact structures WCL. The well contact structure WCL is in contact with a portion of each of the channel patterns CH extending along lower surfaces of the insulating patterns FI. The well contact surface is spaced apart from the source contact surface with each of the insulating patterns FI and the inter-well-source insulating layer SWI, which are interposed therebetween. Each of the well contact structures WCL may be in direct contact with the well structure WE and the connecting part LP by penetrating a portion of the connecting part LP extending the upper surface of the well structure WE.

The connecting part LP of each of the channel patterns CH may include a source junction JN. The source junction JN is a dopant distribution region as a region in the channel patterns CH adjacent to the source contact structures SCL. A dopant distributed in the source junction JN is a dopant diffused from the doped semiconductor pattern SS of the source contact structure SCL, and may include an n-type dopant.

The connecting part LP of each of the channel patterns CH may extend to overlap with the spacer insulating layers IS and the protective pattern PT under the spacer insulating layers IS and the protective pattern PT.

In the above, the slits SI, the source contact structures SCL, and the well contact structures WCL extend along the third direction III.

According to the embodiments of the present disclosure, source select transistors may be defined at intersection portions of the pillar parts PP and the source select line SSL, memory cell transistors may be defined at intersection portions of the pillar parts PP and the word lines WL1 to WLn, and drain select transistors may be defined at intersection portions of the pillar parts PP and the drain select line DSL. The memory cell transistors may be three-dimensionally arranged along the first to third directions I to III to constitute a three-dimensional semiconductor device. The source select transistor may include a gate all around (GAA) structure and a planar structure. The GAA structure of the source select transistor is defined by each of the pillar parts PP and a horizontal conductive pattern (e.g., CP1) used as the source select line SSL. The planar structure of the source select transistor is defined by the source gate pattern GP and the connecting part LP. The drain select transistor and the memory cell transistors may be formed in the GAA structure by the horizontal conductive patterns CP2 to CPk surrounding the pillar parts PP.

The source gate patterns GP remains between the first horizontal conductive pattern CP1 of the source select line SSL and the source junction JN. The source gate pattern GP may be used as the gate electrode of the source select transistor. Since the source gate pattern GP is disposed close to the source junction JN, the turn-on current of the source select transistor may be increased.

The connecting part LP of each of the channel patterns CH includes a part electrically connected to the well structure WE through the well contact structure WCL and a part electrically connected to the source contact structure SCL. The well structure WE includes the dopant of the first conductivity type and the source contact structure SCL includes the dopant of the second conductivity type. The source contact structure SCL and the well contact structure WCL are structurally distinguished from each other by the inter-well-source insulating layer SWI. Thus, the flow of current can be controlled to face the source contact structures SCL in a program operation and a read operation, and holes can be supplied through the well structure WE in an erase operation. Accordingly, in embodiments of the present disclosure, the operation characteristics of semiconductor devices can be improved.

Figure 3:
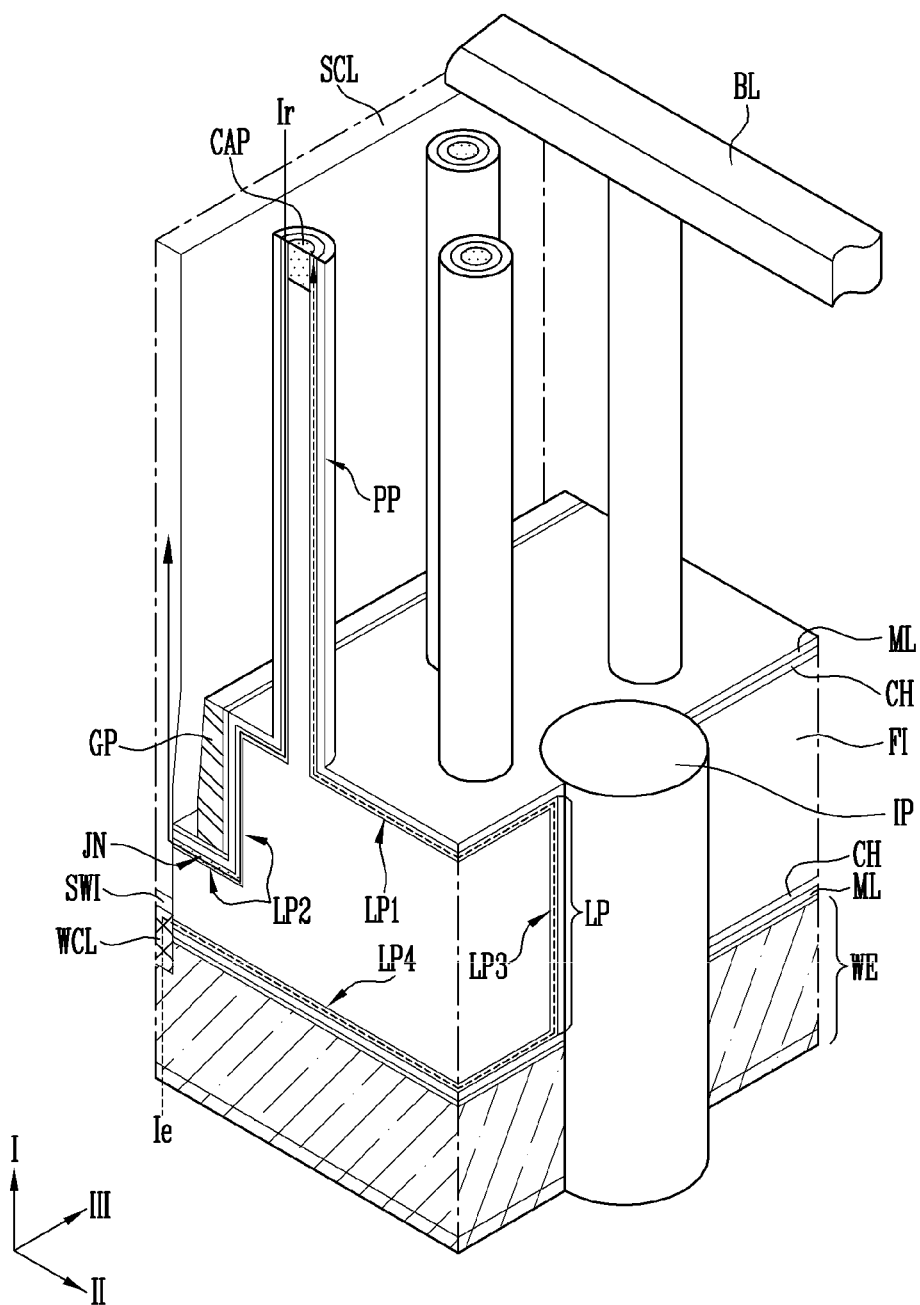
FIG. 3 shows a perspective view illustrating a structure of a channel pattern, according to an embodiment of the present disclosure, and illustrating a flow of current in the channel pattern.

FIG. 3 is a perspective view illustrating in more detail a structure of the channel pattern, according to an embodiment of the present disclosure, and illustrating a flow of current in the channel pattern. In FIG. 3, some components are omitted for convenience of description, and some components are schematically illustrated.

Referring to FIG. 3, the semiconductor device according to an embodiment of the present disclosure may further include a support IP. The support IP may support a space between each of the gate stack structures GST1 and GST2 and the well structure WE, which are shown in FIG. 1A. Although FIG. 3 illustrates one support IP, a plurality of supports may support the space between each of the gate stack structures GST1 and GST2 and the well structure WE. The arrangement of supports will be described in more detail later with reference to FIGS. 4A and 4B. The support IP may extend to the inside of the well structure WE. For example, the support IP may be formed to a depth where it penetrates the well structure WE.

The channel pattern CH includes pillar parts PP and a connecting part LP as described above. The pillar parts PP are parts that extend along the first direction I and penetrate each of the gate stack structures GST1 and GST2 shown in FIG. 1A. The connecting part LP is a part connecting the pillar parts PP.

The connecting part LP of the channel pattern CH may include first to fourth connecting parts LP1 to LP4. The first connecting part LP1 is a part extending along the bottom surface of each of the gate stack structures GST1 and GST2 shown in FIG. 1A from the pillar parts PP. The second connecting part LP2 is a part that extends from the first connecting part LP1 and extends towards the source contact structure SCL along the surface of the source gate pattern GP. The third connecting part LP3 is a part extending along a sidewall of the support IP from the first connecting part LP1. The fourth connecting part LP4 is a part extending along the upper surface of the well structure WE from the third connecting part LP3.

The multi-layered memory pattern ML surrounds outer walls of the pillar parts PP, and extends to an upper surface of the first connecting part LP1. In addition, the multi-layered memory pattern ML extends between the second connecting part LP2 and the source gate pattern GP, between the third connecting part LP3 and the support IP, and between the fourth connecting part LP4 and the well structure WE. The well structure WE is in contact with the fourth connecting part LP4, and the source junction JN is formed in the second connecting part LP2.

The insulating pattern FI extends to fill in a space between the first connecting part LP1 and the fourth connecting part LP4 while being surrounded by the pillar part PP. A central region of each of the pillar parts PP of the channel pattern CH is filled with the insulating pattern FI, and the insulating pattern FI extends to a space between the first connecting part LP1 and the second connecting part LP2. The support IP penetrates the insulating pattern FI.

Each of the pillar parts PP of the channel pattern CH may be connected to a bit line BL corresponding thereto. Although FIG. 3 illustrates one bit line BL for convenience of description, the semiconductor device may include a plurality of bit lines, and the layout of the bit lines may be variously designed.

According to the above-described structure, a first current flow path Ir may be formed during a read operation of the semiconductor device. The first current flow path Ir is formed in the channel pattern CH connected between the bit line BL and the source contact structure SCL. In the read operation, the bit line BL is precharged at a predetermined level. Also, in the read operation, a turn-on voltage may be applied to the drain select line DSL and the source select line SSL, which are shown in FIG. 1A. When a voltage level applied to the word lines WL shown in FIG. 1A is higher than threshold voltages of the memory cell transistors connected to the word lines WL, a channel may be formed in the channel pattern CH between the bit line BL and the source contact structure SCL, and a precharge level of the bit line BL may be discharged through a ground (not shown) electrically connected to the source contact structure SCL.

A second current flow path Ie may be formed during an erase operation of the semiconductor device. The second current flow path Ie is formed in the channel pattern CH connected between the bit line BL and the well structure WE. In the erase operation, an erase voltage may be applied to the well structure WE. Holes may be injected into the channel pattern CH by the erase voltage applied to the well structure WE.

The inter-well-source insulating layer SWI disposed between the source contact structure SCL and the well contact structure WCL can reduce a leakage current between the source junction JN and the well structure WE.

Figure 4A:
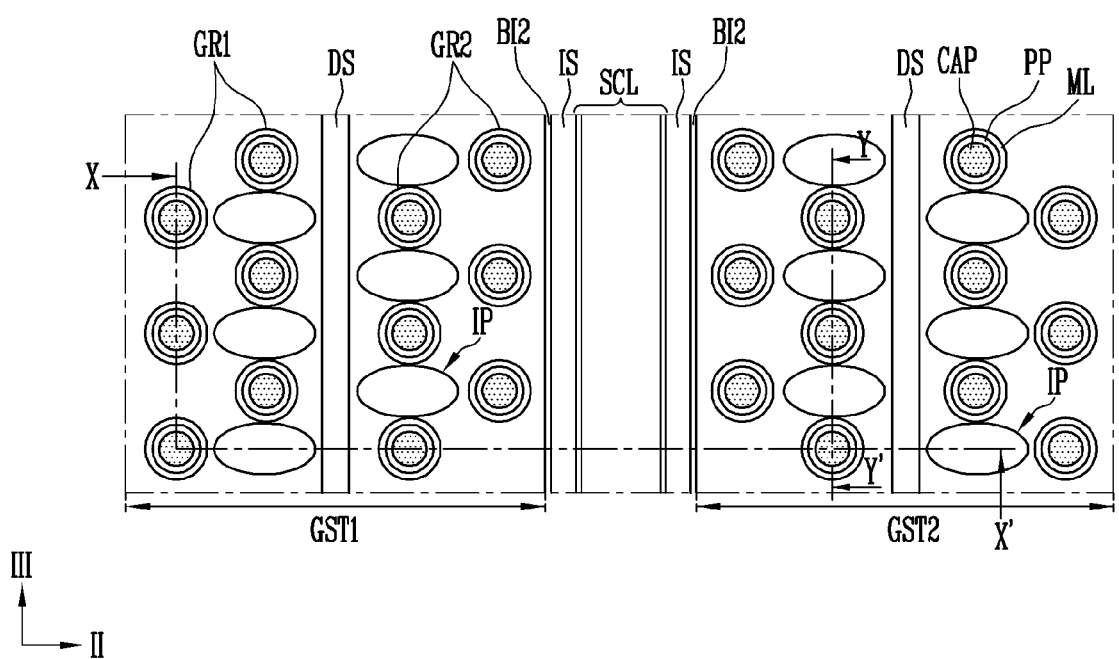

FIGS. 4A and 4B show plan views illustrating a layout of the supports IP, the pillar parts PP of the channel patterns CH, and the source contact structure SCL. The plan view of FIG. 4A is a plan view of the semiconductor device shown in FIG. 1A. FIG. 4B is a modification of the layout of the supports IP and the pillar parts PP.

Referring to FIGS. 4A and 4B, as described above, each of the pillar parts PP may be surrounded by the multi-layered memory pattern ML and surround the capping pattern CAP.

The pillar parts PP penetrating each of the gate stack structures GST1 and GST2 may be divided into a first group GR1 and a second group GR2, which are disposed with the drain separation insulating layer DS interposed therebetween. In order to improve the arrangement density of memory strings, the pillar parts PP of the first group GR1 and the pillar parts PP of the second group GR2 may be arranged in zigzag, as shown.

The gate stack structures GST1 and GST2 are arranged adjacent to each other in the second direction II with the source contact structure SCL interposed therebetween, and may be insulated from the source contact structure SCL by the spacer insulating layer IS. The second blocking insulating layer 612 may remain between each of the gate stack structures GST1 and GST2 and the spacer insulating layer IS.

The supports IP are disposed under the gate stack structures GST1 and GST2 as described in FIG. 3. The supports IP may be disposed between the pillar parts PP not to overlap with the pillar parts PP as shown in FIG. 4A. Alternatively, the supports IP may overlap with portions of the pillar parts PP as shown in FIG. 4B.

Referring to FIGS. 4A and 4B, the supports IP may be disposed between the pillar parts PP adjacent to each other. The support parts IP may be arranged in zigzag, as shown. However, the layout of the supports IP is not limited to the examples shown in FIGS. 4A and 4B, but may be variously modified.

The number of first channel columns defined by the pillar parts PP of the first group GR1 penetrating each of the gate stack structures GST1 and GST2 and the number of second channel columns defined by the pillar parts PP of the second group GR2 penetrating each of the gate stack structures GST1 and GST2 may be variously designed.

For example, as shown in FIG. 4A, first channel columns defined by the pillar parts PP of the first group GR1 may be configured with first and second columns, and second channel columns defined by the pillar parts PP of the second group GR2 may be configured with first and second columns.

Referring to FIG. 4B, first channel columns defined by the pillar parts PP of the first group GR1 may be configured with first to fourth columns, and second channel columns defined by the pillar parts PP of the second group GR2 may be configured with first to fourth columns. In addition, each of the first channel columns defined by the pillar parts PP of the first group GR1 and the second channel columns defined by the pillar parts PP of the second group GR2 may be configured with four or more columns.

The drain separation insulating layer DS may overlap with dummy plugs DP as shown in FIG. 4B. The dummy plugs DP may be arranged in a line along the extending direction of the drain separation insulating layer DS. The dummy plugs DP may be formed using a process of forming the pillar parts PP.

FIGS. 5A to 5P show sectional views illustrating processes included in a manufacturing method of a semiconductor device according to an embodiment of the present disclosure. More specifically, FIGS. 5A to 5P show sectional views illustrating processes performed before a process of forming a source contact structure is performed.

The processes shown by FIGS. 5A to 5P may be used to manufacture the semiconductor devices shown in FIGS. 1A, 1B, and 2. FIGS. 5A to 5P illustrate sectional views taken along lines X-X' and Y-Y' shown in FIG. 4A. The semiconductor device shown in FIG. 4B may also be manufactured using the processes shown by FIGS. 5A to 5P.

Although not shown in the drawings, before the process shown in FIG. 5A is performed, driving transistors constituting a driving circuit for driving the semiconductor device may be formed on a substrate. The process shown by FIG. 5A may be performed on a substrate (not shown) including driving transistors.

Referring to FIG. 5A, a well structure WE including a dopant of a first conductivity type is formed. The process of forming the well structure WE may include a process of forming a first well doped semiconductor layer 101 and a process of forming a second well doped semiconductor layer 103 on the first well doped semiconductor layer 101. The first well doped semiconductor layer 101 includes the dopant of the first conductivity type with a first concentration and the second well doped semiconductor layer 103 includes the dopant of the first conductivity type with a second concentration. The first well doped semiconductor layer 101 and the second well doped semiconductor layer 103 may be doped silicon layers. The process of forming the second well doped semiconductor layer 103 may include a process of forming an undoped silicon layer on the first well doped semiconductor layer 101 and a process of diffusing the dopant of the first conductivity type in the first well doped semiconductor layer 101 into the undoped silicon layer, using a heat treatment process.

Subsequently, a first protective layer 105 may be further formed on the well structure WE. The first protective layer 105 may be formed of a material different from that of a first sacrificial layer 111 formed in a subsequent process. For example, the first protective layer 105 may be formed of an oxide layer.

Subsequently, the first sacrificial layer 111 may be formed on the first protective layer 105, and an etch stop layer 115 may be formed on the first sacrificial layer 111. Before the etch stop layer 115 is formed, a second protective layer 113 may be formed on the first sacrificial layer 111. The etch stop layer 115 is formed on the second protective layer 113.

The first sacrificial layer 111 and the etch stop layer 115 may be formed of materials having different etching rates. The etch stop layer 115 may be used as a gate electrode, and may be formed of a material having etching resistivity against an etching material for etching first and second material layers in a subsequent process. For example, the first sacrificial layer 111 may be formed of an undoped silicon layer. The etch stop layer 115 may be formed of a doped silicon layer. More specifically, the etch stop layer 115 may be formed of a doped silicon layer including an n-type dopant.

The second protective layer 113 may be formed of a material different from those of the first sacrificial layer 111 and the etch stop layer 115. For example, the second protective layer 113 may be formed of an oxide layer.

Figure 5B:
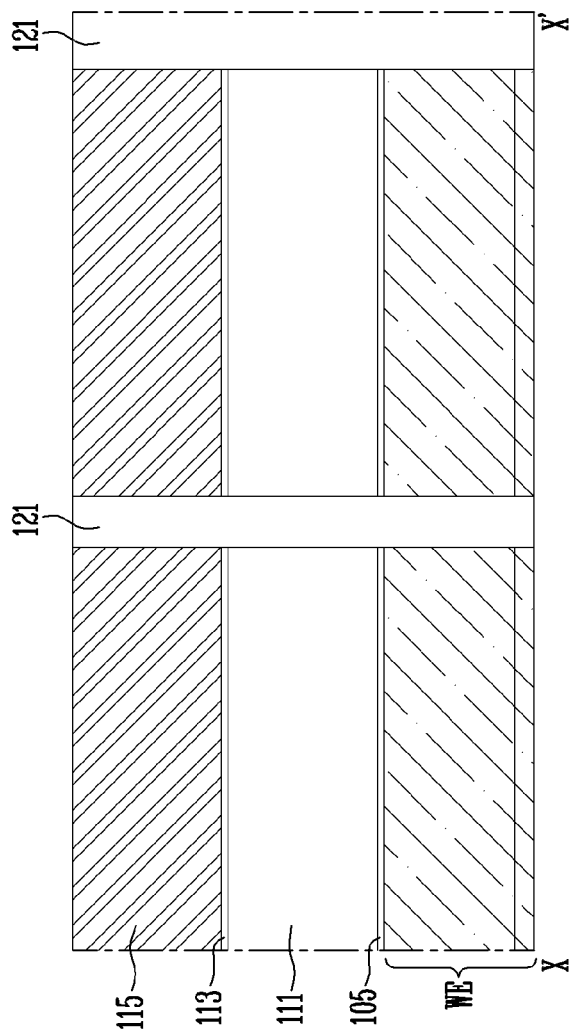
FIGS. 5A to 5P show sectional views illustrating processes included in a manufacturing method of a semiconductor device, according to an embodiment of the present disclosure.

Referring to FIG. 5B, supports 121 penetrating the well structure WE from the etch stop layer 115 may be formed. The supports 121 are disposed to be spaced apart from each other. The process of forming the supports 121 may include a process of forming a mask pattern, using a photolithography process, a process of forming through holes by etching the etch stop layer 115, the second protective layer 113, the first sacrificial layer 111, the first protective layer 105, and the well structure WE through an etching process using the mask pattern as an etching barrier, a process of filling an insulating material in the through holes, a process of planarizing a surface of the insulating material, and a process of removing the remaining mask pattern. Oxide may be used as the insulating material for forming the supports 121.

The supports 121 that penetrate the well structure WE and protrude farther than the well structure WE may be formed using the processes described for FIGS. 5A and 5B.

Figure 5C:
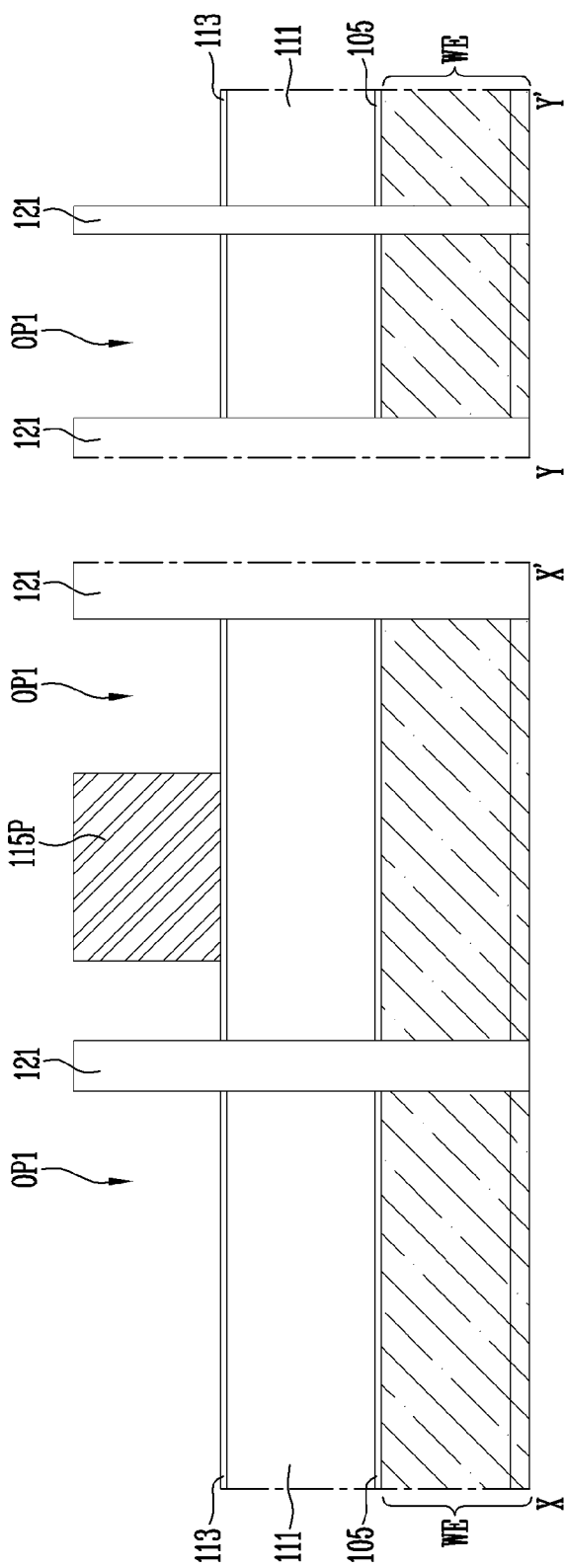

Referring to FIG. 5C, an etch stop pattern 115P may be formed by etching the etch stop layer 115 shown in FIG. 5B. The process of forming the etch stop pattern 115P may include a process of forming a mask pattern, using a photolithography process, a process of etching the etch stop layer 115 shown in FIG. 5B through an etching process using the mask pattern as an etching barrier, and a process of removing the remaining mask pattern. A region in which the etch stop layer is removed in the process of forming the etch stop pattern 115P is defined as a first opening OP1. The first opening OP1 may expose the supports 121 and the second protective layer 113.

Referring to FIG. 5D, a third protective layer 123 may be formed on a surface of the etch stop pattern 115P. The third protective layer 123 may be formed by oxidizing the surface of the etch stop pattern 115P.

Referring to FIG. 5E, an etch-back process may be performed such that a portion of the third protective layer 123 shown in FIG. 5D and a portion of the second protective layer 113 shown in FIG. 5D can be removed. The third protective layer may remain as a third protective pattern 123P on a sidewall of the etch stop pattern 115P, and the second protective layer may remain as a second protective pattern 113P under the etch stop pattern 115P. A portion of the second protective layer 113 may be removed such that the first sacrificial layer 111 is exposed.

Figure 5F:
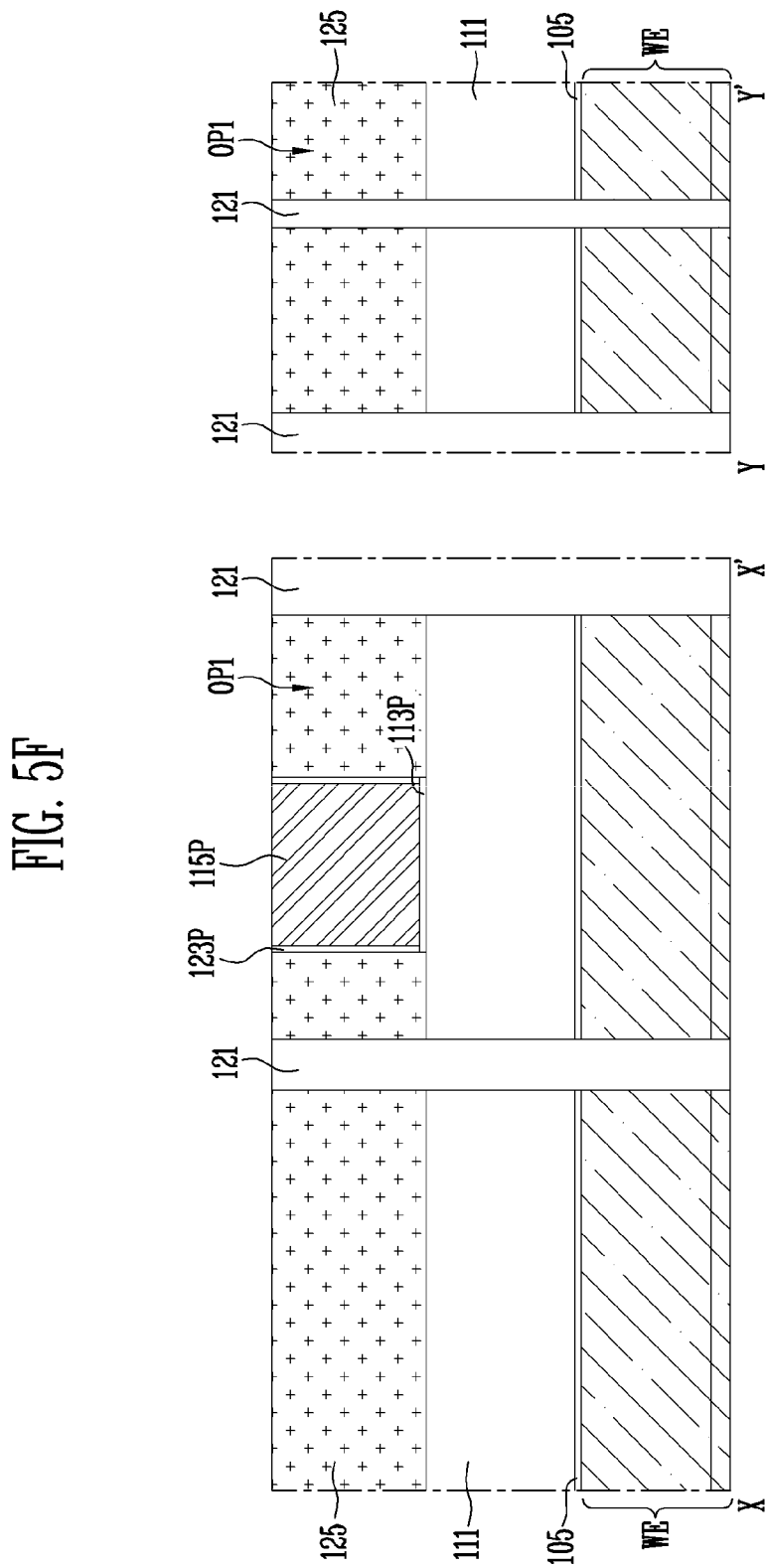

Referring to FIG. 5F, a second sacrificial layer 125 filling the first opening OP1 is formed on the first sacrificial layer 111. The second sacrificial layer 125 may be formed of a material different from that of the first sacrificial layer 111. The second sacrificial layer 125 may be formed of a material having an etching rate different from those of first and second material layers of a stack structure to be formed in a subsequent process. For example, the second sacrificial layer 125 may include a titanium nitride layer (TiN). A surface of the second sacrificial layer 125 may be planarized until the etch stop pattern 115P is exposed.

As the processes described for FIGS. 5A to 5F are sequentially performed, the second sacrificial layer 125 penetrated by the etch stop pattern 115P may be formed on the first sacrificial layer 111.

Referring to FIG. 5G, a stack structure PST is formed by alternately stacking first material layers 131 and second material layers 133 on the etch stop pattern 115P and the second sacrificial layer 125. The stack structure PST may include a first region P1 overlapping with the etch stop pattern 115P and a second region P2 that extends from the first region P1 and does not overlap with the etch stop pattern 115P.

The second material layers 133 are formed of a material different from that of the first material layers 131. The first material layers 131 may be formed of an insulating material for sacrificial layers, and the second material layers 133 may be formed of an insulating material for interlayer insulating layers. More specifically, the first material layers 131 may be formed of a silicon nitride layer, and the second material layers 133 may be formed of a silicon oxide layer.

Some of the first material layers 131 and the second material layers 133 may be penetrated by a drain separation slit SID. The drain separation slit SID may be filled with a drain separation insulating layer DS. The drain separation insulating layer DS is formed to separate drain select lines from each other, and the depth where the drain separation insulating layer DS is formed may be variously modified. The drain separation slit SID and the drain separation insulating layer DS may be omitted if necessary.

Subsequently, holes H may be formed to expose the second sacrificial layer 125 by penetrating the second region P2 of the stack structure PST. The first material layers 131 and the second material layers 133 may be etched to form the holes H. When the second sacrificial layer 125 is formed of a material including a metal such as TiN, the width of a bottom surface of each of the holes H can be widely secured using a difference in etching rate between the stack structure PST and the metal-based second sacrificial layer 125.

Figure 5H:
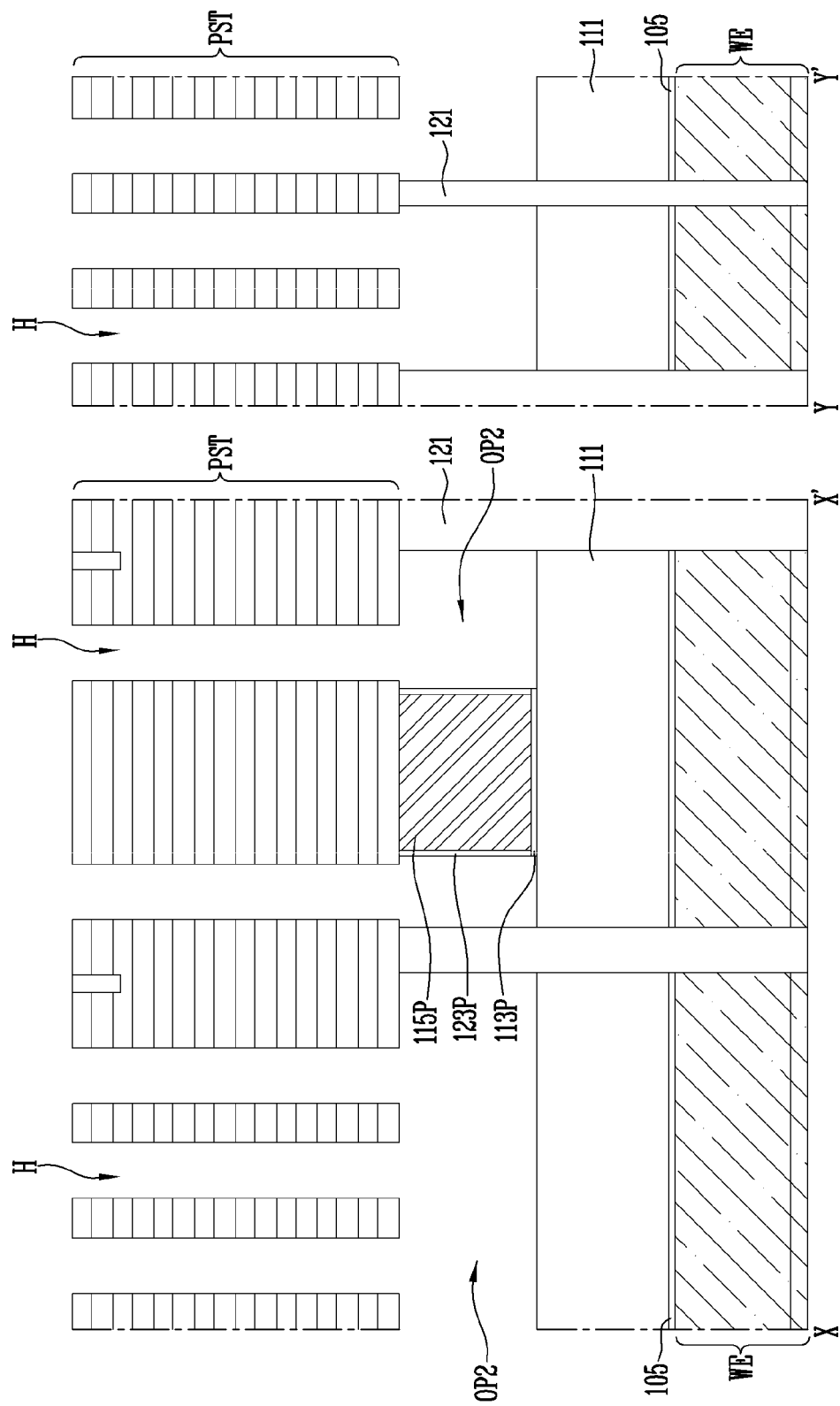

Referring to FIG. 5H, the second sacrificial layer 125 shown in FIG. 5G is selectively removed through the holes H. Accordingly, the first sacrificial layer 111 and the third protective pattern 123P are exposed, and a second opening OP2 connected to the holes H is defined between the stack structure PST and the first sacrificial layer 111.

Figure 5I:
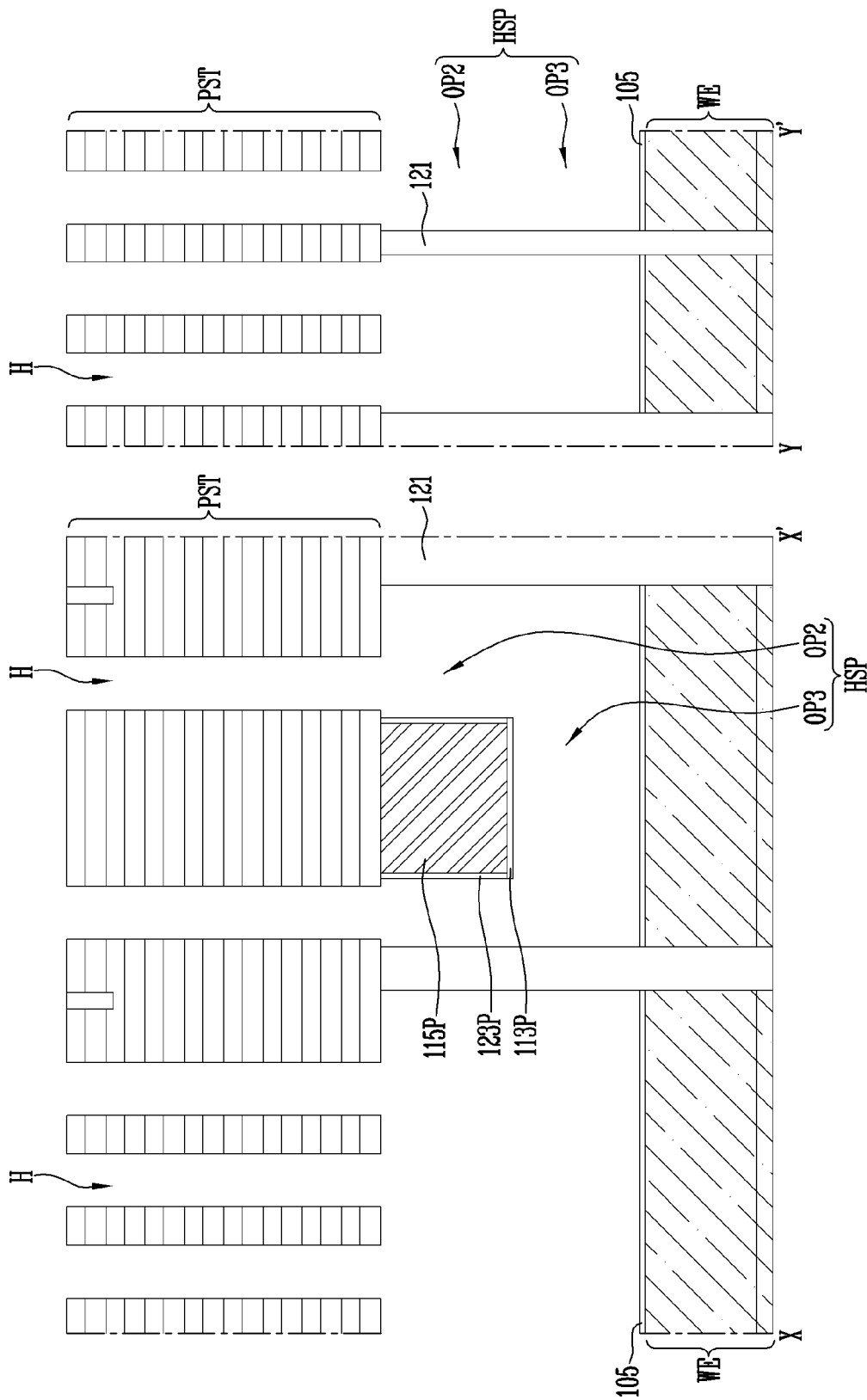

Referring to FIG. 5I, the first sacrificial layer 111 shown in FIG. 5H is selectively removed through the holes H and the second opening OP2. Accordingly, a horizontal space HSP connected to the holes H is opened. The horizontal space HSP is an open region extending between the stack structure PST and the well structure WE and between the etch stop pattern 115P and the well structure WE. The horizontal space HSP may include the second opening OP2 defined in the region in which the second sacrificial layer is removed and a third opening OP3 defined in the region in which the first sacrificial layer is removed.

In the above, while the horizontal space HSP is being opened, the etch stop pattern 115P can be protected by the second protective pattern 113P and the third protective pattern 123P without loss. While the horizontal space HSP is being opened, the well structure WE can be protected by the first protective layer 105 without loss. The horizontal space HSP is supported by the supports 121, so that its gap can be maintained. The etch stop pattern 115P is not separated from the stack structure PST by adhesion, but can be maintained in a state in which it is adhered to the stack structure PST.

Through the series of processes described for FIGS. 5A to 5I, the stack structure PST that is penetrated by the holes H and has the etch stop pattern 115P disposed on a portion of the bottom surface facing the well structure WE is formed on the supports 121. The etch stop patterns 115 are aligned between the supports 121.

Referring to 5J, a multi-layered memory layer 141 is formed on the surface of the opening region. The opening region is a region that includes the holes H and the horizontal space HSP, and is defined by a connection structure of the holes H and the horizontal space HSP. The multi-layered memory layer 141 extends along surfaces of the holes, a surface of the horizontal space HSP, surfaces of the supports 121, and a surface of the etch stop pattern 115P. The process of forming the multi-layered memory layer 141 may include a process of forming a first blocking insulating layer, a process of forming a data storage layer on the first blocking insulating layer, and a process of forming a tunnel insulating layer on the data storage layer. Each of the first blocking insulating layer, the data storage layer, and the tunnel insulating layer may be formed of the same material as described in FIGS. 1B and 2.

Subsequently, a channel layer 143 is formed on a surface of the multi-layered memory layer 141. The channel layer 143 may extend along the surface of the opening region including the holes H and the horizontal space HSP, the surfaces of the supports 121, and the surface of the etch stop pattern 115P, and be surrounded by the multi-layered layer 141.

The channel layer 143 may be formed of a semiconductor layer. For example, the channel layer 143 may be formed by depositing a silicon layer. The channel layer 143 may be formed as an integrated layer without any boundary surface.

Subsequently, the holes H and the horizontal space HSP, which are not filled with the channel layer 143 but remain, are filled with a gap fill insulating layer 145. The gap fill insulating layer 145 is formed on the channel layer 143. The process of forming the gap fill insulating layer 145 may include a process of filling the holes H and the horizontal space HSP with a material layer having liquidity and a process of curing the material layer having liquidity. Polysilazane (PSZ) may be used as the material layer having liquidity.

A process of allowing a portion of the gap fill insulating layer 145 to be recessed may be further performed such that the height of the gap fill insulating layer 145 is lower than that of the channel layer 143. A central region of the channel layer 143 exposed on the gap fill insulating layer 145 may be filled with a capping pattern 147. The capping pattern 147 may be formed of a doped silicon layer including a dopant of a second conductivity type.

Referring to FIG. 5K, a slit SI exposing sidewalls of the first material layers 131 and the second material layers 133 is formed by etching the first material layers 131 and the second material layers 133, which are disposed in the first region P1 of the stack structure PST, through a first etching process. The etch stop pattern 115P is formed of a material having etching resistivity against an etching material for etching the first and second material layers 131 and 133. Accordingly, it is difficult to remove the etch stop pattern 115P through the first etching process, and hence the depth of the first slit SI1 formed through the first etching process can be uniformly controlled such that the first slit SI1 penetrates the stack structure PST but does not penetrate the etch stop pattern 115P. A first surface SU1 of the etch stop pattern 115P defined through the first etching process may be formed. The first surface SU1 is toward the first slit SI1 and is an inclined surface.

Referring to FIG. 5L, a second slit SI2 connected to the first slit SI1 is formed by etching the etch stop pattern 115P shown in FIG. 5K through a second etching process. The second etching process is performed using an etching material capable of easily etching the etch stop pattern 115P. The second slit SI2 is formed to a depth where it completely penetrates the etch stop pattern 115P. An etching material used in the second etching process is different from that used in the first etching process.

Through the processes described by FIGS. 5K and 5L, the etch stop pattern 115P may be separated into source gate patterns GP by the slit SI including the first slit SI1 and the second slit SI2. A second surface SU2 of each of the source gate patterns GP defined through the second etching process is almost vertically formed as compared with the first surface SU1. The width W2 of the second slit SI2 may be formed narrower than that W1 of the first slit SI1.

Each of the width W1 of the first slit SI1 and the width W2 of the second slit SI2 is formed narrower than that of the etch stop pattern 115P shown in FIG. 5K. Accordingly, the etch stop pattern 115P remains at both sides of the slit SI.

Figure 5M:
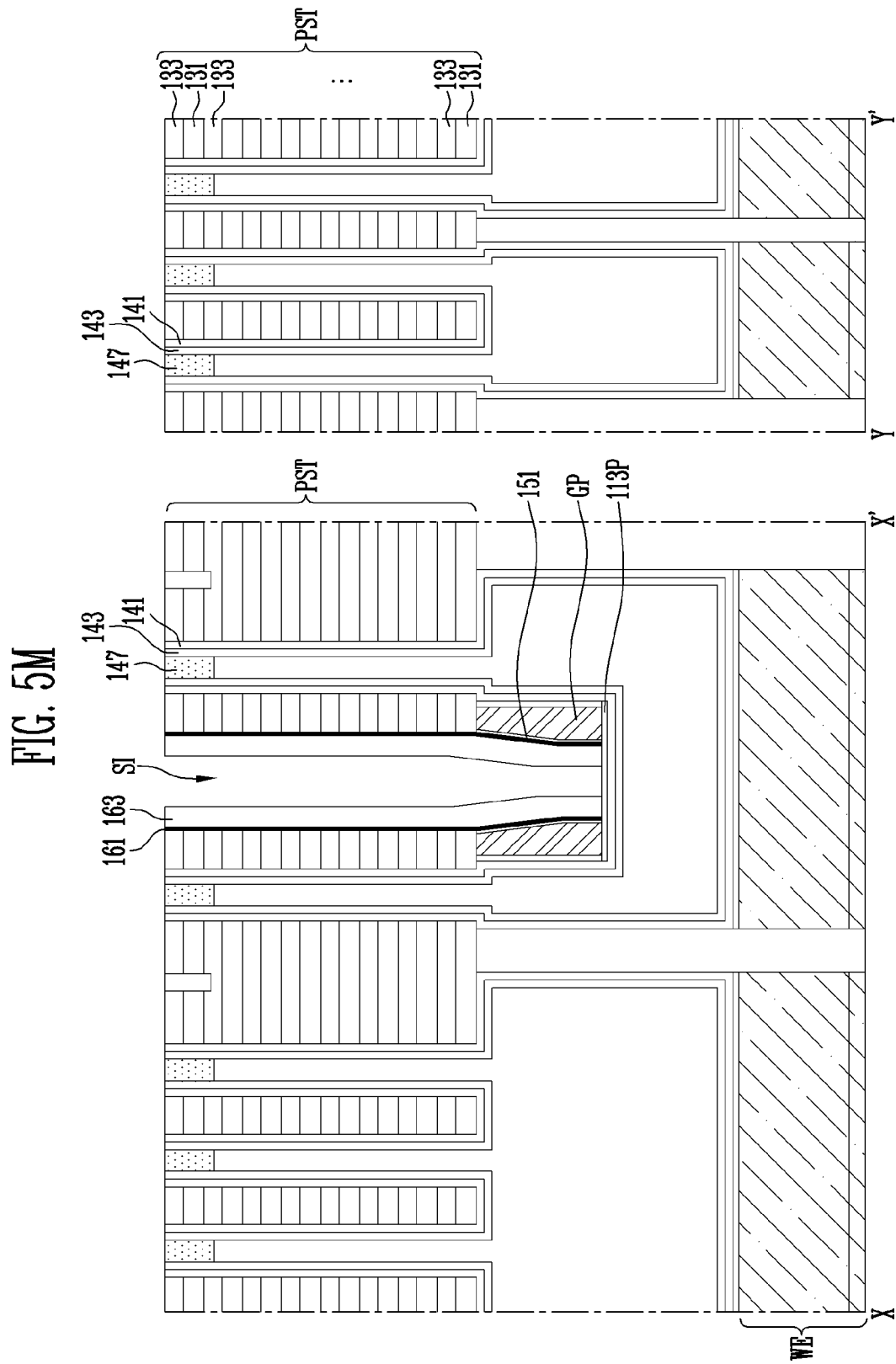

Referring to FIG. 5M, after the slit SI is formed, a fourth protective layer 151 may be formed by oxidizing a surface of each of the source gate patterns GP exposed through the slit SI.

Subsequently, a fifth protective layer 161 is formed on sidewalls of the fourth protective layer 151 and the slit SI. The fifth protective layer 161 is a layer formed to protect the stack structure PST in subsequent processes. The fifth protective layer 161 may be formed of a nitride layer.

Subsequently, a sixth protective layer 163 may be formed on the fifth protective layer 161. The sixth protective layer 163 may be formed of an oxide layer.

The fifth protective layer 161 and the sixth protective layer 163 are etched such that a bottom surface of the slit SI is opened, and remain to cover the sidewall of the slit SI.

Figure 5N:
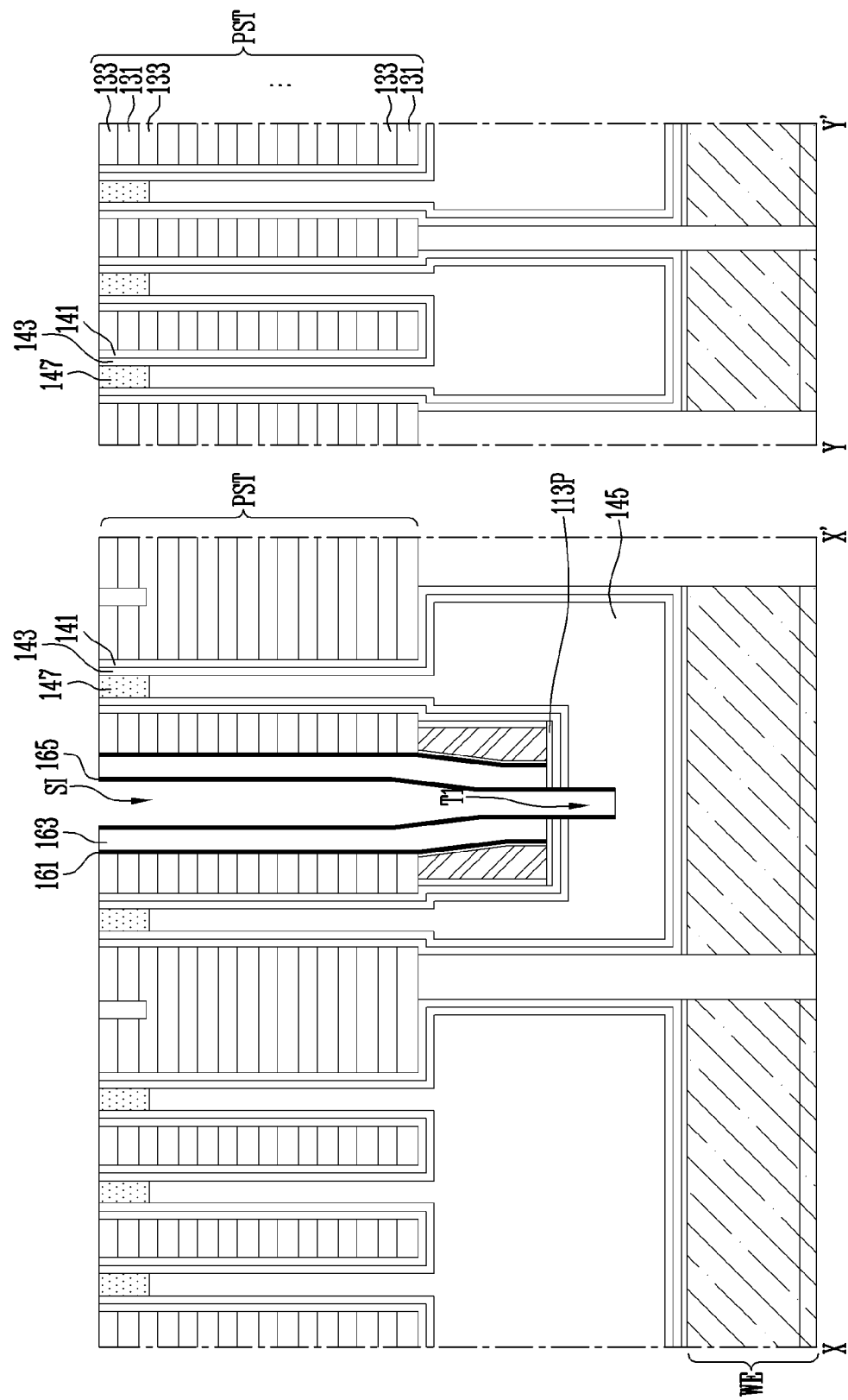
Figure 50:
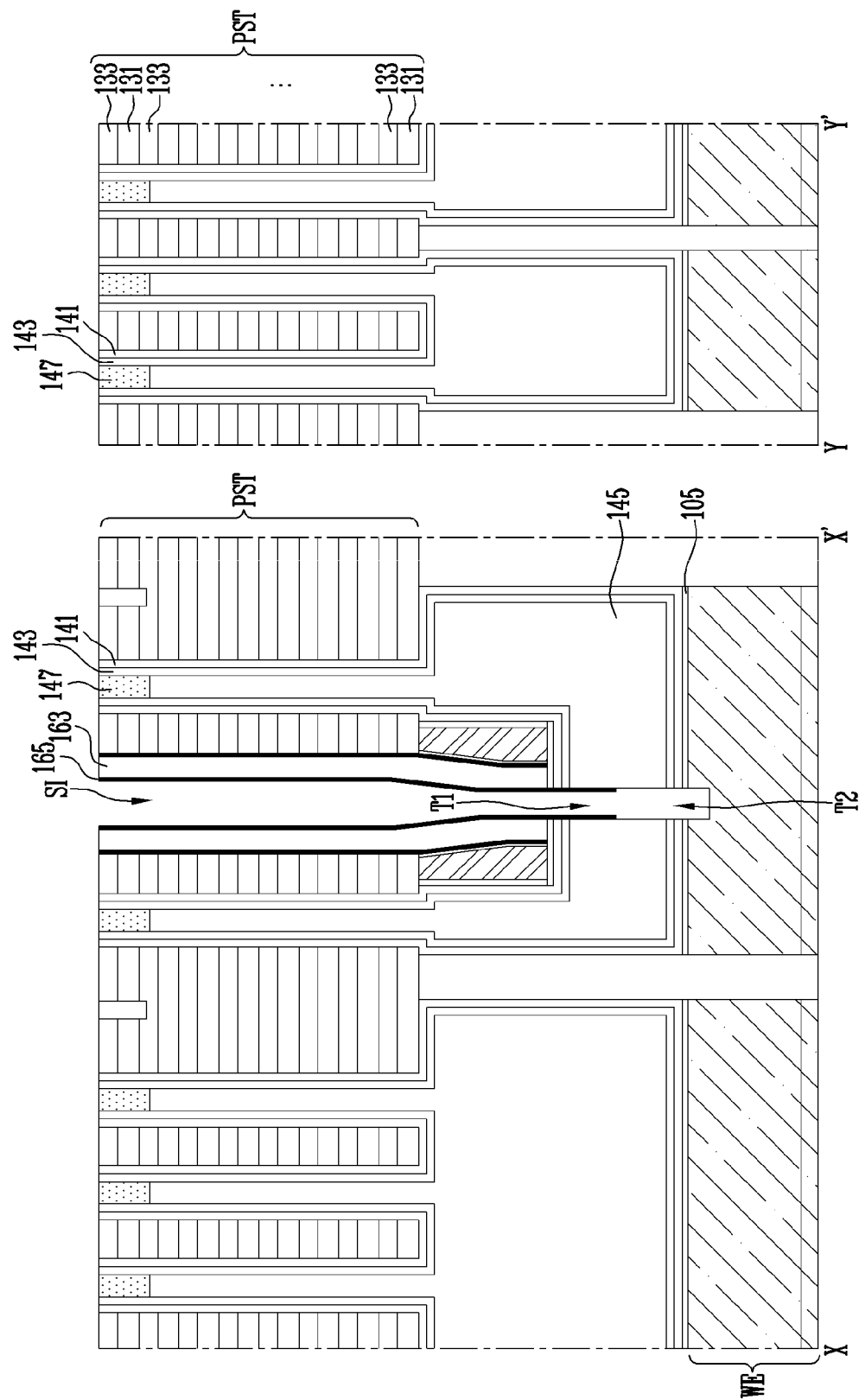

Referring to FIG. 5N, the second protective pattern 113P, the multi-layered memory layer 141, and the channel layer 143, which are not blocked by the fifth protective layer 161 and the sixth protective layer 163 and are exposed through the bottom surface of the slit SI, are etched through an etching process. Accordingly, a first trench T1 is formed, which penetrates the second protective pattern 113P, the multi-layered memory layer 141, and the channel layer 143, and extends to the inside of the gap fill insulating layer 145. The first trench T1 is connected to the slit SI.

Referring to FIG. 5O, a channel protective layer 165 is formed, which extends to cover a sidewall of the sixth protective layer 163 and a sidewall of the first trench T1. The channel protective layer 165 blocks a first end portion of the channel layer 143, which is exposed through the sidewall of the first trench T1. The channel protective layer 165 may be formed of a material layer having an etching rate different from that of the oxide layer. For example, channel protective layer 165 may be formed of a nitride layer. The process of forming the channel protective layer 165 may include a process of depositing a nitride layer and a process of etching the nitride layer through an etch-back process such that the gap fill insulating layer 145 can be exposed through the first trench T1.

Subsequently, a second trench T2 exposing the well structure WE is formed by etching the gap fill insulating layer 145, the channel layer 143, the multi-layered memory layer 141, and the first protective layer 105, which are exposed under the first trench T1.

By the first trench T1 and the second trench T2, which are connected to the slit SI, the channel layer 143 may be separated into channel patterns, the multi-layered memory layer 141 may be separated into multi-layered memory patterns, and the gap fill insulating layer 145 may be separated into insulating patterns. The second trench T2 may extend to the inside of the well structure WE.

Referring to FIG. 5P, the second trench T2 is filled with a well contact structure 171. The well contact structure 171 is in direct contact with the well structure WE and a second end portion of the channel layer 143, which are exposed through the second trench T2. The well contact structure 171 may be formed of a semiconductor layer.

The process of the well contact structure 171 may include a process of allowing a silicon layer to be grown from the well structure WE and the second end portion of the channel layer 143, which are exposed through the second trench T2.

The first end portion of the channel layer 143, which is disposed above the gap fill insulating layer 145 and is defined by the first trench T1, is blocked by the channel protective layer 165 while the well contact structure 171 is being grown. Thus, the well contact structure 171 is not connected to the first end portion of the channel layer 143, which is disposed above the gap fill insulating layer 145. The dopant of the first conductivity type in the well structure may be diffused into the well contact structure 171. The well contact structure 171 may be formed not by using a growth method but by using a deposition method.

Subsequently, an inter-well-source insulating layer 173 may be formed by oxidizing an upper portion of the well contact structure 171 through the first trench T1. Since the first end portion of the channel layer 143 is blocked by the channel protective layer 165, the first end portion of the channel layer 143 is not oxidized.

FIGS. 6A to 6G show sectional views illustrating an embodiment of subsequent processes continued after a process shown in FIG. 5P. The processes shown in FIGS. 6A to 6G may be used to manufacture the semiconductor device shown in FIGS. 1A and 1B.

Referring to FIG. 6A, the channel protective layer 165 shown in FIG. 5P is removed such that the first end portion of the channel layer 143, which is disposed above the gap fill insulating layer 145, is exposed.

Subsequently, a doped semiconductor layer 175 is formed, which extends to the inside of the slit SI from the inside of the first trench T1. The doped semiconductor layer 175 may be a doped silicon layer including a dopant of the second conductivity type. The dopant of the second conductivity type may have a conductivity type opposite to that of the dopant of the first conductivity type in the well structure WE. The dopant of the second conductivity type may be an n-type dopant, and the dopant of the first conductivity type may be a p-type dopant. The doped semiconductor layer 175 completely fills in the first trench T1 formed with a relatively narrow width. However, the doped semiconductor layer 175 does not completely fill in the slit SI formed with a relatively wide width, and may be conformally formed on the sixth protective layer 163. A central region of the slit SI is not filled with the doped semiconductor layer 175 but may be opened. According to the embodiment of the present disclosure, although the doped semiconductor layer 175 is formed using a deposition process which is advantageous in cost saving, a lower portion of the slit SI and the first trench T1 can be easily filled without any void, using the inclined first surface SU1 shown in FIG. 5L.

Referring to FIG. 6B, a doped semiconductor pattern 175P is formed by etching the doped semiconductor layer shown in FIG. 6A through the opened central region of the slit SI. The doped semiconductor pattern 175P may remain in a shape extending from the inside of the first trench T1 to between the source gate patterns GP.

Referring to FIG. 6C, a sixth protective pattern 163P is formed by etching a portion of the sixth protective layer 163 shown in FIG. 6B. The sixth protective pattern 163P remains with a height lower than that of the doped semiconductor pattern 175P to expose a first part of the doped semiconductor pattern 175P.

Subsequently, a seventh protective layer 177 is formed by oxidizing a surface of the first part of the doped semiconductor pattern 175P, which extends farther than the sixth protective pattern 163P. The seventh protective layer 177 may serve as an etching protective layer capable of preventing loss of the doped semiconductor pattern 175P in a subsequent etching process.

Referring to FIG. 6D, a fifth protective pattern 161P is formed by etching a portion of the fifth protective layer 161 shown in FIG. 6C. The fifth protective layer 161 is etched such that a sidewall of the stack structure PST is exposed. A protective pattern PT including the sixth protective pattern 163P and the fifth protective pattern 161P may remain between each of the source gate patterns GP and the doped silicon pattern 175P. The protective pattern PT can prevent the multi-layered memory layer 141 from being damaged in a subsequent process.

Subsequently, the first material layers of the stack structure PST are selectively removed. Hereinafter, the regions in which the first material layers are removed are defined as gate regions 181.

Referring to FIG. 6E, horizontal conductive patterns 185 may be formed in the gate regions 181. The horizontal conductive patterns 185 and the second material layers 133 may constitute gate stack structures GST1 and GST2.

Before the horizontal conductive patterns 185 are formed, a second blocking insulating layer 183 may further formed on surfaces of the gate regions 181 and the slit SI. The second blocking insulating layer 183 extends along the surfaces of the gate regions 181, extends along sidewalls of the second material layers 133, which face the slit SI, and extends along surfaces of the source gate patterns GP, a surface of the protective pattern PT, and a surface of the first part of the doped semiconductor pattern 175P.

The second blocking insulating layer 183 may be formed of a high-k insulating layer. More specifically, the second blocking insulating layer 183 may include an aluminum oxide layer. The aluminum oxide layer may be deposited in an amorphous state and then crystallized through a heat treatment process.

The horizontal conductive patterns 185 may be metal layers having a resistance lower than that of the source gate patterns GP. The doped semiconductor pattern 175P and the source gate patterns GP are protected by the fourth protective layer 151 and the seventh protective layer 177 while an etching process of opening the gate regions 181 by removing the first material layers and an etching process of separating the horizontal conductive patterns 185 are being performed.

The dopant of the first conductivity type in the doped semiconductor pattern 175P may be diffused into the channel layer 143 adjacent to the doped semiconductor pattern 175P, using a heat treatment process. Accordingly, a source junction JN is formed in the channel layer 143. The source junction JN may be formed using a heat treatment process for forming the second blocking insulating layer 183, or be formed by additionally performing a separate heat treatment process. The source junction JN may be distributed in the channel layer 143 under the source gate patterns GP.

The source gate patterns GP remain to be used as source select lines. Accordingly, although it is difficult to uniformly control the diffusion range of the dopant of the second conductivity type, the distance between the remaining source gate pattern GP and the source junction JN is short, and thus the turn-on current of the source select transistor can be increased. In other words, the turn-on current of the source select transistor can be stably secured through the remaining source gate pattern GP.

Referring to FIG. 6F, a spacer insulating layer 187 is formed on the protective pattern PT. The spacer insulating layer 187 fills in a space between the doped semiconductor pattern 175P and the protective pattern PT, and extends on the sidewall of the slit SI. The spacer insulating layer 187 extends to cover the sidewall of each of the gate stack structures GST1 and GST2.

The process of forming the spacer insulating layer 187 may include a process of depositing an insulating layer along the surface of the slit SI and a process of etching the insulating layer through an etch-back process. The second blocking insulating layer and the seventh protective layer may be etched while the insulating layer is being etched. Accordingly, the second blocking insulating layer is separated into second blocking insulating patterns 183P, and the seventh protective layer remains as a protective pattern 177P on a sidewall of the doped semiconductor pattern 175P.

Figure 6G:
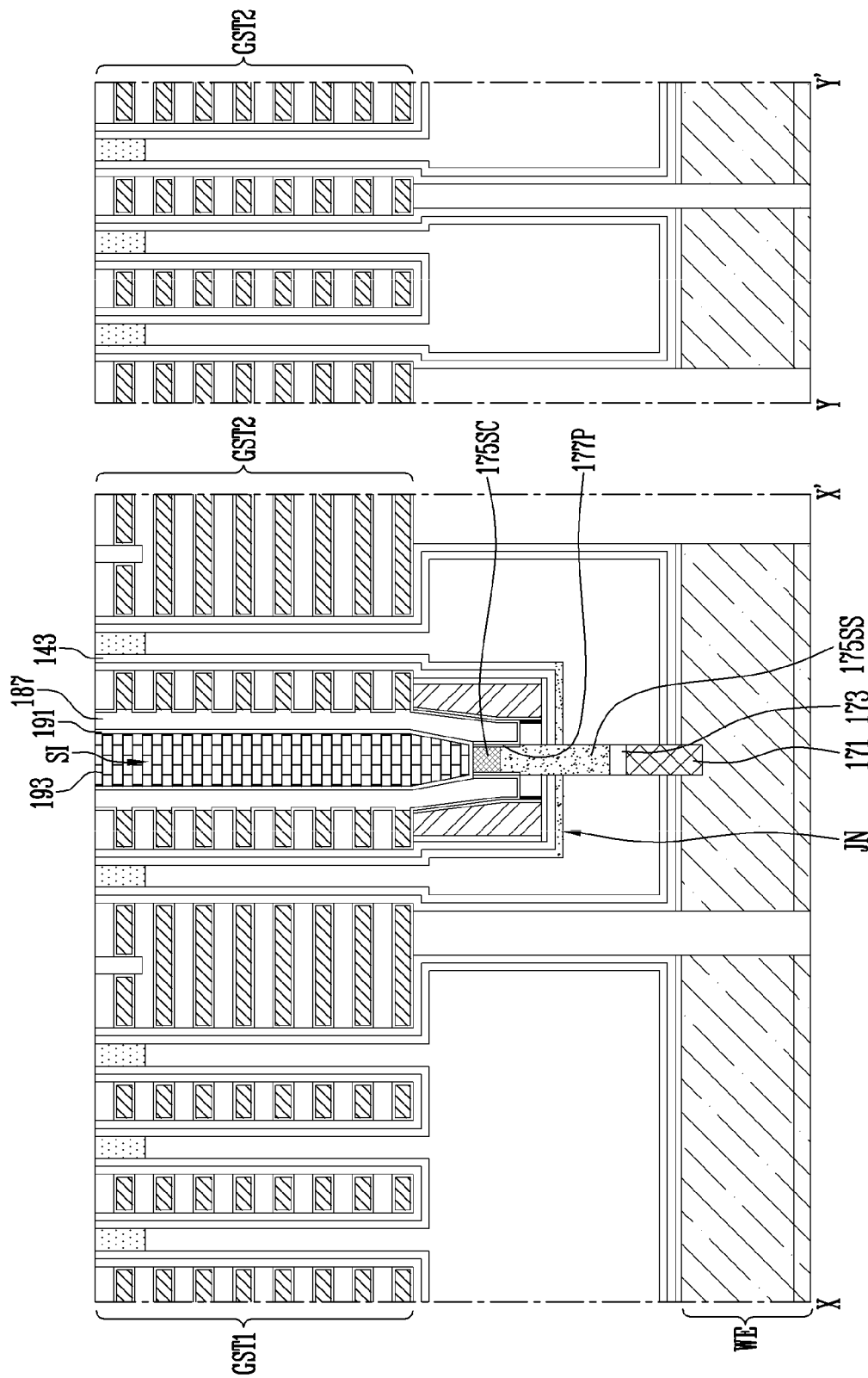

Referring to FIG. 6G, the doped semiconductor pattern 175P shown in FIG. 6F is changed into a metal silicide layer 175SC by silicidizing a partial thickness of the doped semiconductor pattern 175 from an upper surface of the doped semiconductor pattern 175P. A portion of the doped semiconductor pattern 175P, which is not changed into the metal silicide layer 175SC, remains as a doped semiconductor pattern 175SS. Since the metal silicide layer 175SC has a resistance lower than the doped semiconductor pattern 175SS, the metal silicide layer 175SC can decrease the resistance of the source contact structure.

The silicidizing process may include a process of depositing a metal layer and an annealing process of inducing a reaction between the metal layer and the doped semiconductor pattern 175P shown in FIG. 6F. The source junction JN may be formed by diffusing the dopant of the second conductivity type in the doped semiconductor pattern into the channel layer 143, using the annealing process performed while the silicidizing process is being performed.

The metal layer for the silicidizing process may include various metal layers such as nickel and tungsten. The metal silicide layer 175SC formed through the silicidizing process may include nickel silicide, tungsten silicide, etc.

Subsequently, a metal barrier layer 191 is formed on surfaces of the spacer insulating layer 187 and the metal silicide layer 175SC. Subsequently, the process of forming the metal barrier layer 191 may include a process of forming a metal layer 193 on the metal barrier layer 191 such that the slit SI is completely filled. The metal layer 193 may include tungsten so as to decrease the resistance of the source contact structure. The metal barrier layer 191 may include a titanium nitride layer, a tungsten nitride layer, a tantalum nitride layer, etc. to prevent diffusion of metal from the metal layer 193.

FIGS. 7A to 7C show sectional views illustrating an embodiment of the subsequent processes continued after a process shown by FIG. 5P. The sectional views shown in FIGS. 7A to 7C correspond to region B shown in FIG. 5P. The processes shown by FIGS. 7A to 7C may be used to manufacture the semiconductor device shown in FIG. 2.

The well structure WE, the first protective layer 105, the multi-layered memory layer 141, the channel layer 143, the well contact structure 171, the inter-well-source insulating layer 173, the gap fill insulating layer 145, the second protective pattern 113, the source gate patterns GP, the slit SI, the first material layer 131, the second material layer 133, the fourth protective layer 151, the fifth protective layer 161, the sixth protective layer 163, and the first trench T1, which are shown in FIG. 7A, may be formed using the processes described in FIGS. 5A to 5P.

After the processes described by FIGS. 5A to 5P are performed, the channel protective layer 165 shown in FIG. 5P is removed. Accordingly, as shown in FIG. 7A, the first end portion of the channel layer 143, which is disposed above the gap fill insulating layer 145, is exposed by the first trench T1. In addition, a first blocking insulating layer 141a, a data storage layer 141b, and a tunnel insulating layer 141c of a portion of the multi-layered memory layer 141, which is disposed on the gap fill insulating layer 145, are exposed by the first trench T1. In addition, a portion of the gap fill insulating layer 145 is exposed by the first trench T1.

Referring to FIG. 7B, the gap fill insulating layer 145 and the tunnel insulating layer 141c are selectively etched through the sidewall of the first trench T1. The first blocking insulating layer 141a and the second protective pattern 113P, which are exposed through the first trench T1, and the sixth protective layer 163 exposed through the slit SI may be etched.

An undercut region UC may be defined under the first end portion of the channel layer 143 adjacent to the first trench T1 through the above-described etching process. The undercut region UC may also be formed between the data storage layer 141b and the channel layer 143.

The undercut region UC is formed using an etching material for etching the gap fill insulating layer 145, the first blocking insulating layer 141a, the tunnel insulating layer 141c, and the second protective layer 113P, which are formed of oxide, with a high etching rate, as compared with the data storage layer 141b formed of nitride and the channel layer 143 formed of a semiconductor layer. The channel layer 143 and the data storage layer 141b between the gap fill insulating layer 145 and the channel layer 143 may remain in a shape extending farther toward the first trench T1 than the first blocking insulating layer 141a, the tunnel insulating layer 141c, and the second protective pattern 113P.

Referring to FIG. 7C, a doped semiconductor pattern 275SS is formed such that the undercut region UC shown in FIG. 7B is completely filled. The process of forming the doped semiconductor pattern 275SS is the same as described in FIG. 6A.

Subsequently, a protective pattern PT including a sixth protective pattern 163P and a fifth protective pattern 161P, a seventh protective pattern 277P, a horizontal conductive pattern 285, a second blocking insulating pattern 283P, a source junction JN, a spacer insulating layer 287, a metal silicide layer 275SC, a metal barrier layer 291, and a metal layer 293 are formed using the same processes as described in FIGS. 6A to 6G.

Figure 8:
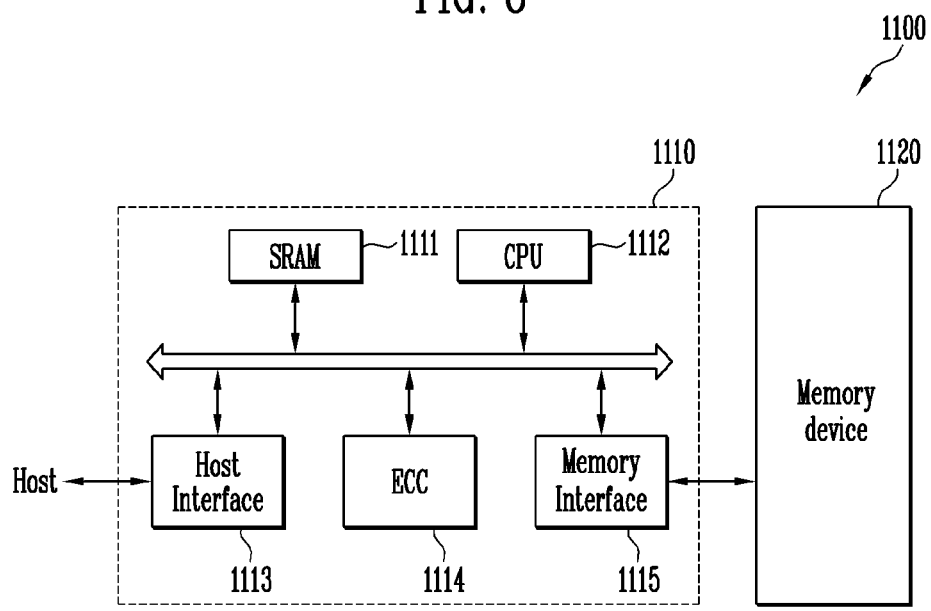
FIG. 8 shows a block diagram illustrating a configuration of a memory system, according to an embodiment of the present disclosure.

FIG. 8 shows a block diagram illustrating a configuration of a memory system 1100 according to an embodiment of the present disclosure.

Referring to FIG. 8, the memory system 1100 includes a memory device 1120 and a memory controller 1110.

The memory device 1120 may include at least one of the structure shown in FIGS. 1A and 1B and the structure shown in FIG. 2. The memory device 1120 may be a multi-chip package configured with a plurality of flash memory chips.

The memory controller 1110 is configured to control the memory device 1120, and may include a static random access memory (SRAM) 1111, a CPU 1112, a host interface 1113, an error correction code (ECC) 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicated with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

Figure 9:
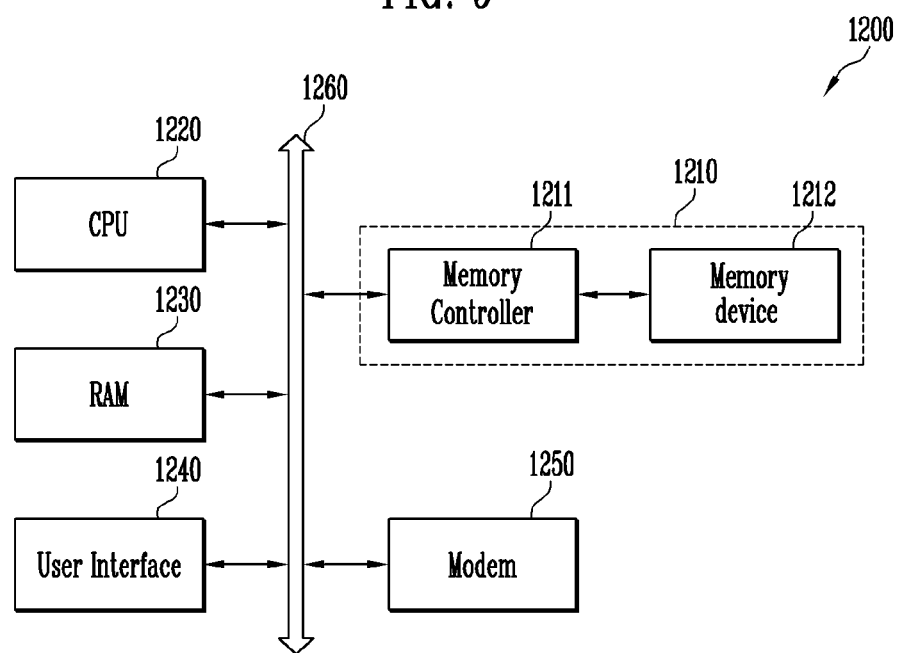
FIG. 9 shows a block diagram illustrating a configuration of a computing system, according to an embodiment of the present disclosure.

FIG. 9 shows a block diagram illustrating a configuration of a computing system 1200 according to an embodiment of the present disclosure.

Referring to FIG. 9, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

The memory system 1210, as described with reference to FIG. 8, may be configured with a memory device 1212 and a memory controller 1211.

According to the present disclosure, the etch stop pattern that can serve as an etch stop layer remains at only a portion of the bottom surface of the stack structure, so that electrical characteristics of the semiconductor device can be improved. Accordingly, the operational reliability of the three-dimensional semiconductor device can be improved.

Further, according to the present disclosure, the remaining structure of an etch stop pattern is designed such that the etch stop pattern can serve as a source gate pattern. Thus, the turn-on current of the source select transistor connected to the source gate pattern can be increased. Accordingly, the operational reliability of the three-dimensional semiconductor device can be improved.

The above-described embodiments are provided for the purpose of conveying an understanding the technical spirit of the present disclosure. The scope of the present disclosure should not be limited to the above-described embodiments. It will be obvious to those skilled in the art to which the present disclosure pertains that other modifications based on the technical spirit of the present disclosure may be made in addition to the above-described embodiments.

Unless otherwise defined, all terms including technical and scientific terms used herein have the same meaning as commonly understood by one of ordinary skill in the art to which the present disclosure belongs. Unless otherwise defined in the present disclosure, the terms should not be construed as being ideal or excessively formal.

What is claimed is:
1. A semiconductor device comprising:
  a source contact structure extending along a first direction;
  a first gate stack structure disposed on a first side of the source contact structure, the first gate stack structure including a side region adjacent to the first side of the source contact structure and including a center region, opposite the source contact structure, extending from the side region of the first gate stack structure;

a first source gate pattern disposed under the side region of the first gate stack structure, the first source gate pattern comprising an inclined surface facing the source contact structure; and a first channel pattern extending along an underside of the center region of the first stack structure, penetrating the center region of the first stack structure, and extending toward and contacting the first side of the source contact structure.

2. The semiconductor device of claim 1, further comprising:

a second gate stack structure disposed on a second side of the source contact structure, the second gate stack structure including a side region adjacent to the second side of the source contact structure and including a center region, opposite the source contact structure, extending from the side region of the second gate stack structure;

a second source gate pattern disposed under the side region of the second gate stack structure, the second source gate pattern comprising an inclined surface facing the source contact structure; and a second channel pattern extending along an underside of the center region of the second stack structure, penetrating the center region of the second stack structure, and extending toward and contacting the second side of the source contact structure.

3. The semiconductor device of claim 2, wherein the inclined surface of the first source gate pattern and the inclined surface of the second source gate pattern are inclined such that a distance between the first and second source gate patterns decreases with increasing distance below the first and second gate stack structures.

4. The semiconductor device of claim 1, wherein the inclined surface of the first source gate pattern is inclined such that a width of the first source gate pattern decreases with decreasing distance below the first gate stack structure.

5. The semiconductor device of claim 1, further comprising:

a well contact structure aligned under the source contact structure;

an inter-well-source insulating layer disposed between the well contact structure and the source contact structure;

a well structure in contact with a lower portion of the well contact structure, the well structure extending to overlap with the first and second gate stack structures;

supports penetrating the well structure, each of the supports extending toward the first gate stack structure; and a spacer insulating layer extending from between the first stack structure and the first side of the source contact structure to between the first source gate pattern and the first side of the source contact structure, wherein the first channel pattern extends under the spacer insulating layer, extends along sidewalls of the supports, extends along an upper surface of the well structure, and is in contact with the well contact structure.

6. The semiconductor device of claim 5, further comprising:

a multi-layered memory pattern extending along an interface between the well structure and the first channel pattern, an interface between each of the supports and the first channel pattern, an interface between the first source gate pattern and the first channel pattern, and an interface between the first gate stack structure and the first channel pattern, the multi-layered memory pattern extending under the spacer insulating layer, wherein the multi-layered memory pattern includes:

a blocking insulating layer surrounding the first channel pattern;

a data storage layer between the blocking insulating layer and the first channel pattern; and a tunnel insulating layer between the data storage layer and the first channel pattern.

7. The semiconductor device of claim 6, wherein:

the data storage layer and the first channel pattern each includes an extension part protruding father toward the source contact structure than the blocking insulating layer and the tunnel insulating layer.

8. The semiconductor device of claim 7, wherein the source contact structure comprises a sidewall which a groove into which the extension part extends.

9. The semiconductor device of claim 5, wherein:

the well structure includes a first doped semiconductor layer including a dopant of a first conductivity type; and the source contact structure includes a second doped semiconductor layer including a dopant of a second conductivity type different from the first conductivity type.

10. The semiconductor device of claim 9, wherein:

the first channel pattern includes a source junction in contact with the second doped semiconductor layer, the source junction having the dopant of the second conductivity type, which is distributed in the source junction.

11. The semiconductor device of claim 1, wherein each of the first and second gate stack structures includes horizontal conductive patterns and interlayer insulating layers, which are alternately stacked in the first direction.

12. The semiconductor device of claim 11, wherein the horizontal conductive patterns are formed of a conductive material different from that of the source gate patterns.

13. A semiconductor device comprising:

source contact structures;

source gate patterns disposed between the source contact structures and spaced apart from each other;

a gate stack structure disposed between the source contact structures, the gate stack structure including side regions aligned above the source gate patterns and a center region between the side regions;

a spacer insulating layer disposed between each of the source contact structures and the gate stack structure;

a protective pattern aligned under the spacer insulating layer, the protective pattern being disposed between the source contact structure and the source gate pattern; and a channel pattern penetrating the gate stack structure, extending along a bottom surface of the gate stack structure, extending along surfaces of the source gate patterns, and extending along a bottom surface of the protective pattern, the channel pattern having source contact surfaces in contact with the source contact structures.

14. The semiconductor device of claim 13, further comprising:

a well structure disposed under the source gate patterns, the well structure extending to overlap with the gate stack structure and the source contact structures; and supports supporting the gate stack structure over the well structure, wherein the channel pattern extends along sidewalls of the supports and along an upper surface of the well structure.

15. The semiconductor device of claim 14, further comprising:

well contact structures aligned under the source contact structures, the well contact structures extending toward and contacting the well structure; and inter-well-source insulating layers disposed between the well contact structures and the source contact structures, wherein the channel pattern has well contact surfaces in contact with the well contact structures.

16. The semiconductor device of claim 14, wherein the well structure includes a first doped semiconductor layer including a dopant of a first conductivity type, and the source contact structure includes a second doped semiconductor layer including a dopant of a second conductivity type different from the first conductivity type.

17. The semiconductor device of claim 14, wherein the source contact structures extend farther toward the well structure than the source gate patterns.

18. The semiconductor device of claim 14, further comprising an insulating pattern penetrating the center region of the gate stack structure, the insulating pattern extending to fill a space between the source gate patterns and the well structure and a space between the source gate patterns, the insulating pattern being surrounded by the channel pattern.

19. The semiconductor device of claim 14, wherein each of the source contact structures includes;

a metal layer extending to face a sidewall of the gate stack structure;

a doped semiconductor pattern extending toward the well structure under the metal layer, the doped semiconductor pattern protruding farther toward the metal layer than the protective pattern;

a metal silicide layer aligned between the doped semiconductor pattern and the metal layer; and a metal barrier layer extending along an interface between the metal silicide layer and the metal layer and an interface between the spacer insulating layer and the metal layer, wherein the source contact surfaces are defined along surfaces of the channel pattern in contact with the doped semiconductor patterns.

20. The semiconductor device of claim 19, wherein the protective pattern includes:

an oxide layer disposed between each of the source gate patterns and the doped semiconductor patterns; and a nitride layer disposed between the oxide layer and each of the source gate patterns.

21. The semiconductor device of claim 19, wherein the spacer insulating layer extends between each of the source gate patterns and the doped semiconductor pattern.

22. The semiconductor device of claim 21, further comprising an etching protective layer extending from between the spacer insulating layer and the metal silicide layer to between the spacer insulating layer and the doped semiconductor pattern.

23. The semiconductor device of claim 21, further comprising an aluminum oxide layer extending along an interface between the spacer insulating layer and the metal silicide layer, an interface between the spacer insulating layer and the doped semiconductor pattern, an interface between the protective pattern and the spacer insulating layer, and an interface between each of the source gate patterns and the spacer insulating layer.

24. The semiconductor device of claim 13, wherein the gate stack structure includes horizontal conductive patterns alternately stacked with interlayer insulating layers.

25. The semiconductor device of claim 13, wherein a source junction comprising a distributed n-type dopant is formed in the channel pattern adjacent to the source contact structures.

26. The semiconductor device of claim 13, wherein the channel pattern includes a first extension part formed to penetrate into each of the source contact structures.

27. The semiconductor device of claim 13, further comprising a multi-layered memory pattern extending along an outer surface of the channel pattern, wherein the multi-layered memory pattern includes:

a tunnel insulating layer surrounding the channel pattern;

a data storage layer surrounding the channel pattern with the tunnel insulating layer interposed between the channel pattern and the data storage layer; and a blocking insulating layer surrounding the channel pattern with the data storage layer and the tunnel insulating layer interposed between the channel pattern and the blocking insulating layer, wherein the data storage layer includes a second extension part formed to penetrate into each of the source contact structures.

28. The semiconductor device of claim 13, wherein each of the source gate patterns includes an inclined surface facing one of the source contact structures.

* * * * *